(12) United States Patent
Higuchi et al.

(10) Patent No.: US 6,342,710 B1
(45) Date of Patent: *Jan. 29, 2002

(54) SEMICONDUCTOR INTEGRATED CIRCUIT

(75) Inventors: Hisayuki Higuchi, Kokubunji (JP); Suguru Tachibana, Damascus (SY); Koichiro Ishibashi, Warabi; Keijiro Uehara, Sagamihara, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/521,957

(22) Filed: Mar. 9, 2000

Related U.S. Application Data

(63) Continuation of application No. 08/913,407, filed as application No. PCT/JP96/00701 on Mar. 18, 1996, now Pat. No. 6,121,646.

(30) Foreign Application Priority Data

Mar. 17, 1995 (JP) .............................. 7-058491
Sep. 8, 1995 (JP) .............................. 7-231024

(51) Int. Cl.[7] .............................................. H01L 29/76
(52) U.S. Cl. ...................................... 257/213; 257/238
(58) Field of Search ................................ 257/213, 238, 257/288

(56) References Cited

FOREIGN PATENT DOCUMENTS

| JP | 59231789 | 12/1984 |
|----|----------|---------|
| JP | 60117495 | 6/1985 |
| JP | 62293596 | 12/1987 |
| JP | 63308796 | 12/1988 |
| JP | 1-220293 | 9/1989 |
| JP | 4-134792 | 5/1992 |
| JP | 7-282586 | 10/1995 |

*Primary Examiner*—Roy Potter

(74) *Attorney, Agent, or Firm*—Antonelli, Terry, Stout & Kraus, LLP

(57) ABSTRACT

A semiconductor integrated circuit, particularly a circuit for a high-speed low-power-consumption table look-aside buffer mounted in a microprocessor LSI. The semiconductor integrated circuit is provided with field effect transistors for comparing inputted multibit data signals with stored data and a coincidence-detecting signal line (25) to which current is applied at least while the data signals are compared with stored data. When the data signals coincide with the stored data, the transistors (26) conduct. The number of transistors (26) is equal to that of the inputted data signals. The drains of the transistors (260 are connected in parallel, and the sources are also connected in parallel and supplied with a predetermined voltage. By the integrated circuit, whether or not the inputted data signals coincide with the stored data is detected by detecting the potential of the coincidence-detecting signal line (25) upon a change of the applied current.

12 Claims, 19 Drawing Sheets

81

91

SEMICONDUCTOR INTEGRATED CIRCUIT

CROSS-REFERENCE TO RELATED APPLICATION

This application is a continuation of application Ser. No. 08/913,407, filed on Dec. 5, 1997, the entire disclosure is hereby incorporated by reference. Which is a 371 of PCT/JP96/00701 filed Mar. 18, 1996.

TECHNICAL FIELD

The present invention relates to a semi-conductor integrated circuit, and more particularly to a circuit for a high speed, low power consumption Table Look aside Buffer using a content addressable memory mounted on a microprocessor LSI.

BACKGROUND ART

A cache memory is provided between a central processing unit and a main memory of a computer system in order to speed up the operation speed, the cache memory functioning as a high speed buffer memory and storing a portion of programs and data to be stored in the main memory.

Virtual addresses are used with recent central processing units so that address translation is required between virtual addresses and real addresses of the cache memory and main memory. Since the size of a translation table becomes large as the address space becomes large, the table is generally structured hierarchically. It takes some time to refer to the hierarchical table and find a real address. In order to obtain a real address at high speed, tables having an associative function called a Table Look aside Buffer (TLB) are provided in parallel as hierarchical tables.

TLB is therefore required to execute address translation at high speed and also at high hit probability while using a small circuit scale.

Two types of associative schemes, full associative and set associative, are used for TLB. With the former scheme, an input address is compared with all data stored in TLB to check coincidence/non-coincidence therebetween. If there is coincident data stored in TLB, a signal indicating a data presence and the stored data are output.

With the latter set associative scheme, candidates of coincident data are selected, and an input data is compared with these candidate addresses to check coincidence/non-coincidence therebetween. If there is coincident data, a signal indicating a data presence and a real address corresponding to the coincident data are output.

As above, since the full associative scheme compares all data, the number of comparators increases and the circuit area becomes large. In order to suppress an increase in the circuit area, a simple circuit having a small area is used as the comparator. Therefore, a time required for data comparison becomes long, and because of a number of comparators, power consumption becomes great. Although there are such disadvantages, a data coincidence probability becomes high because the comparison is executed for all stored data.

In the case of TLB of the set associative scheme, the number of comparators is as small as two to four sets because candidates for compared data are selected and the coincidence/non-coincidence check is performed only for these candidates. Accordingly, a high speed comparator circuit can be used and coincidence detection can be performed at high speed, although the comparator circuit becomes complicated. However, a restriction of candidate selection lowers a data coincidence probability. Therefore, a coincidence probability generally equal to the full associative TLB cannot be obtained unless the scale of the TLB storage circuit is increased by about a fourfold. This expansion of the circuit scale increases the number of operating circuits, leaving some issues of an increased power consumption and an increased circuit area.

An example of a coincidence-detecting circuit for the full associative scheme is described in JP-A-59-231789 in which a coincidence-detecting circuit is provided independently for each memory cell for the comparison between search data and stored data. An example of a coincidence-detecting circuit of this type for higher speed operations is described in IEEE Journal of Solid State Circuits Vol. 28, No. 11, pp. 1078–1083. According to this report, a reference signal line is provided in parallel with a coincidence-detecting signal line and also with a current supply line, and a differential type NOR gate is formed by coincidence-detecting MOSFETs, for the purpose of high speed detection. This approach has a restriction of the circuit area because of a need of three wiring lines, although high speed operation is realized.

An example of TLB of the set associative scheme is described in JP-A-60-117495 in which a circuit for the comparison with search data utilizes a sense amplifier for reading memory cell data.

DISCLOSURE OF INVENTION

An object of the invention is to provide a high speed, low power consumption data coincidence-detecting circuit and TLB using this circuit, TLB (Table Look aside Buffer) being of the full associative scheme.

The issues of the above-described prior art are high speed, low power consumption, and small circuit area. If the operation speed and consumption power of TLB of the full associative scheme can be made equal to or better than those of TLB of the set associative scheme, TLB with a higher coincidence probability can be obtained by using TLB of smaller scale (integration).

For the first issue of speeding up the data coincidence detection of an associative memory, a reference potential is generated for the comparison with a coincidence signal line potential. High speed operation can be realized through coincidence detection by a differential amplifier circuit by using the reference potential. In the coincidence detection by the differential amplifier circuit in static operation by using the reference potential, a small change in voltage can be detected, and in addition because a margin for timing adjustment is not required, high speed operation can be realized.

For the second issue of low power consumption of a coincidence-detecting circuit, the potentials of a coincidence signal line and a reference signal line are maintained in advance at a MOSFET threshold voltage value or lower and only the potential of the coincidence signal line is raised high to operate the detection circuit. In this manner, the potentials of the non-coincidence signal line and the reference signal line allow current to hardly flow through MOSFETs and the differential detection circuit is operated only during the period necessary for signal detection. One to four sets of high speed comparator circuit are additionally provided for an input address. The coincident addresses of past data up to one to four sets are output from the memory circuits storing the corresponding data sets, without operating the main unit of TLB. In this manner, high speed and low power consumption are realized. A coincidence of three to five bits of the input address is checked by a pre-comparator, and power is supplied only to comparators corresponding to the coincident addresses. In this manner, the number of operations of comparators can be reduced to ⅛ or more, and the power consumption can be reduced to ⅕ or more.

The circuit of this invention uses a differential amplifier circuit for a coincidence detection of an associative memory. A coincidence-detecting circuit is operating in a pulsate manner, and one to four sets of pre-comparator circuits are provided. In accordance with a comparison result by the pre-comparator circuit, only the coincidence-detecting circuits corresponding to the coincident addresses are supplied with power. In this manner, power can be supplied in a concentrated way both in the time and space so that low power consumption can be realized without degrading high speed operation.

In the circuit of this invention, a predetermined current is supplied to the coincidence-detecting signal line of the associative memory, and a change in the potential of the coincidence-detecting signal line is checked to detect a coincidence/non-coincidence to thereby speed up the operation of the detector circuit and simplify the circuit. In order to check a potential change of the coincidence-detecting signal line at higher speed, the reference signal line is provided and a potential difference between both the lines is detected by a differential amplifier circuit, to achieve a faster operation. The coincidence-detecting circuit is operated in a pulsate way, and one to four sets of pre-comparator 25 circuits are provided. In accordance with a comparison result, only the coincidence-detecting circuits corresponding to the coincident addresses are supplied with power. Therefore, it is possible to supply power in a concentrated manner both in the time and space and the low power consumption can be realized without degrading the high speed operation.

BEST MODE FOR CARRYING OUT THE INVENTION

Embodiments of the invention will be described with reference to the accompanying drawings.

Figure 1:
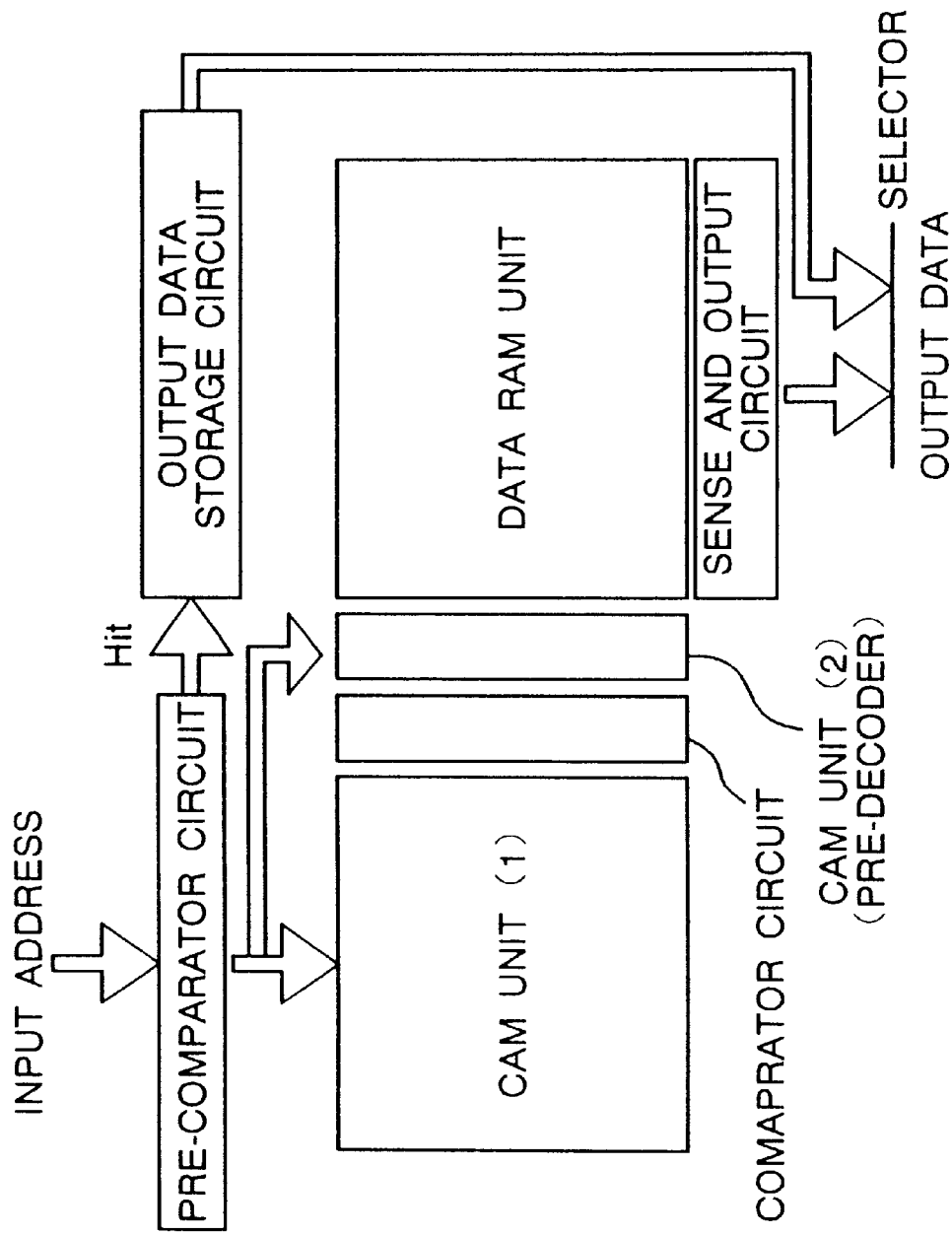
FIG. 1 is a block diagram showing the structure of a TLB circuit of this invention.

FIG. 1 shows an example of the structure of a TLB using a coincidence-detecting circuit of this invention. An input address is a virtual address (hereinafter represented by VA) which is supplied to a pre-comparator circuit and to CAM (content addressable memory) units 1 and 2. If the pre-comparator circuit detects a coincidence, a Hit signal is generated and an output data storage circuit outputs stored data. Although not shown in FIG. 1, the output data storage circuit has a circuit for stopping a power supply to a comparator circuit when the Hit signal is generated.

If the pre-comparator circuit confirms non-coincidence, a power is supplied to the comparator circuit, and if the CAM units 1 and 2 confirm a coincidence, data in a data RAM unit is output via a sense circuit and an output circuit. Although the details will be later described with reference to FIG. 4, the function of the CAM unit 2 will be described now. In the CAM unit 2, a signal of about three bits among the input address is supplied to the comparator circuits which check coincidence/non-coincidence at high speed. In accordance with this check result, a power is supplied to the comparator circuit. In this manner, a power is supplied only to ⅛ of the comparator circuits if an input address is in quite a random state. Namely, the consumption power of the comparator circuit can be reduced by ⅛. It is possible to distribute part of the considerably reduced power to the comparison circuit to thereby achieve high speed operation. Since only an operation of reading data stored in advance is executed when the pre-comparator circuit detects a coincidence, the data can be output at high speed.

Figure 2:
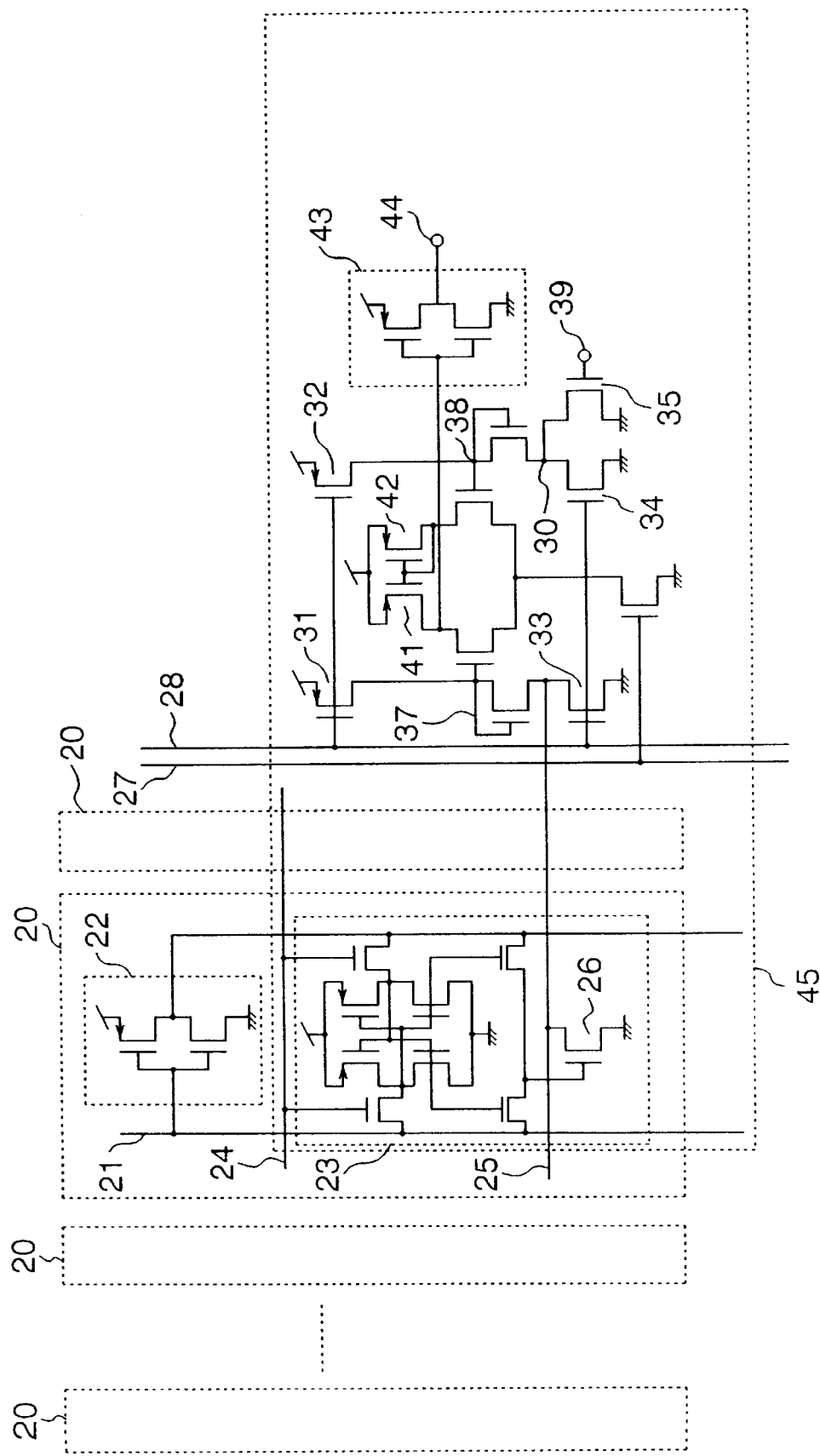
FIG. 2 is a circuit diagram showing the structure of a pre-comparator circuit of the invention.

FIG. 2 shows an example of the circuit diagram of the pre-comparator circuit.

Reference numeral 21 represents one bit of VA. reference numeral 22 represents an inverter for generating a complementary signal. Reference numeral 23 represents a memory cell having a comparator circuit. Reference numeral 24 represents a word line which operates to store data on the bit line 21 in the memory cell 23. The circuits for selecting and driving a word line are not shown. Such circuits have a structure widely used and the description thereof is considered unnecessary.

The circuit described above corresponds to one bit of VA, and is provided in parallel as many as the number of bits of VA to be compared. Reference numeral 25 represents a coincidence-detecting signal line. An N-type MOSFET 26 is designed to turn off when the input VA and the memory cell data are coincident. The signal line 25 is connected in parallel to all bits of the input VA, and only when the all bits of the input VA and the stored data are coincident, the signal line 25 is disconnected from a ground terminal. Reference numerals 27 and 28 represent signal lines used for supplying a power to the comparator circuit. The signal line 27 is maintained at a positive power potential, and the signal line 28 is maintained at a ground potential. A supply of power can be stopped during the period while signal comparison is not necessary.

When the data are not coincident, current approximately equal to that flowing through MOSFET 26 is supplied from P-type MOSFETs 31 and 32 via a diode-connected N-type MOSFET 37 to the coincidence-detecting signal line 25. Since an N-type MOSFET 33 is turned off, the potential of the signal line 25 rises. Current supplied from the P-type MOSFET 32 is supplied via a diode-connected MOSFET 38 to an N-type MOSFET 35. MOSFET 35 has a configuration same as or generally same as that of MOSFET (e.g., MOSFET 26) of the comparator circuit. When the data are not coincident, a potential same as or generally same as that applied to the gate of MOSFET 26 is applied to the gate 39. In order to generate such a potential, a circuit same as the comparator circuit is additionally provided and designed to be in the data non-coincidence state. Namely, a so-called dummy circuit is provided, which is simple and suitable for setting a precise potential.

A change in the potentials at terminals 37 and 38 in the above state will be described. When MOSFET of only one comparator circuit is in a non-coincidence state, the potential of the signal line 25 becomes highest because MOSFETs of the comparator circuits become conductive as many as the number of non-coincidence MOSFETs. At this time, the terminals 37 and 38 take generally the same potential. Therefore, currents flowing through right and left portions of the differential circuit are generally same. This differential circuit is designed such that the circuit takes a high potential output when the same current flows thorough the right and left portions by using different sizes of P-type MOSFETs 41 and 42 as the loads of the differential circuit. Namely, under the non-coincidence state, a signal 44 output via an inverter driver 43 takes the ground potential.

If the input VA 21 changes from this state and the input data becomes coincident with the data stored in the memory cell 23, the data on the signal line 25 further rises so that the potential at the terminal 37 becomes higher than that at the terminal 38 and the effects of different sizes of P-type MOSFETs are cancelled out. Therefore, the potential at the output terminal 44 starts rising and a data coincidence can be detected. If the input data becomes not coincident again, the operation to follow can be understood easily and so the description thereof is omitted.

In the above description, the potentials at the lines 27 and 28 are assumed to be constant. In the description to follow, it is assumed that the potential at the line 27 is the ground potential and that at the line 28 is the positive power potential in the initial state and thereafter the potential at the line 27 changes to the positive power potential and that at the line 28 changes to the ground potential.

In the initial state described above, MOSFETs 33 and 34 are conductive and MOSFETs 31 and 32 are non-conductive. Therefore, the potentials at the terminals 37 and 38 are higher than the ground potential by an amount of the threshold voltages of diode-connected MOSFETs 37 and 38. If the potentials at the lines 27 and 28 change to take the high potential at the line 27 and the ground potential at the line 28, the potentials at the terminals 37 and 38 start rising. In this case, if all the comparator circuits are in the coincidence state, the potential at terminal 37 rises faster than that at the terminal 38 so that immediately thereafter, an output of the differential circuit becomes a comparison result. Namely, with the initial state set as above, the potentials at the terminals 37 and 38 are equal at the operation start so that coincidence/non-coincidence can be detected at correspondingly higher speed. In a high speed operation circuit with the initial state being set, it is necessary to design so that the coincidence-detecting signal line 25 and a reference signal line 30 have generally the same characteristics in terms of both d.c. and a.c., by adding an electrostatic capacitor generally equal to that at the signal line 25, to the circuit node 30. Namely, a capacitor 36 equal to the parasitic capacitor of the detecting signal line is added to the terminal 30.

The circuit 45 surrounded by a broken line has been described above. Sixty four to one hundred and twenty eight sets of circuits 45 are disposed in parallel in TLB to compare the input VA. Data stored in the data RAM unit (refer to FIG. 1) corresponding to the coincident set of the circuit 45 is output.

As described above, in this embodiment a change in the potential of a hit coincidence-detecting signal line is made largest among a plurality of coincidence-detecting signal lines. It is therefore possible to judge a coincidence if the potential or its change exceeds a preset value. Accordingly, a static circuit can be used and a divisional bit detection becomes easy. Furthermore, since the reference signal is generated to perform the coincidence detection by the differential amplifier, coincidence/non-coincidence can be detected much faster.

Figure 3:
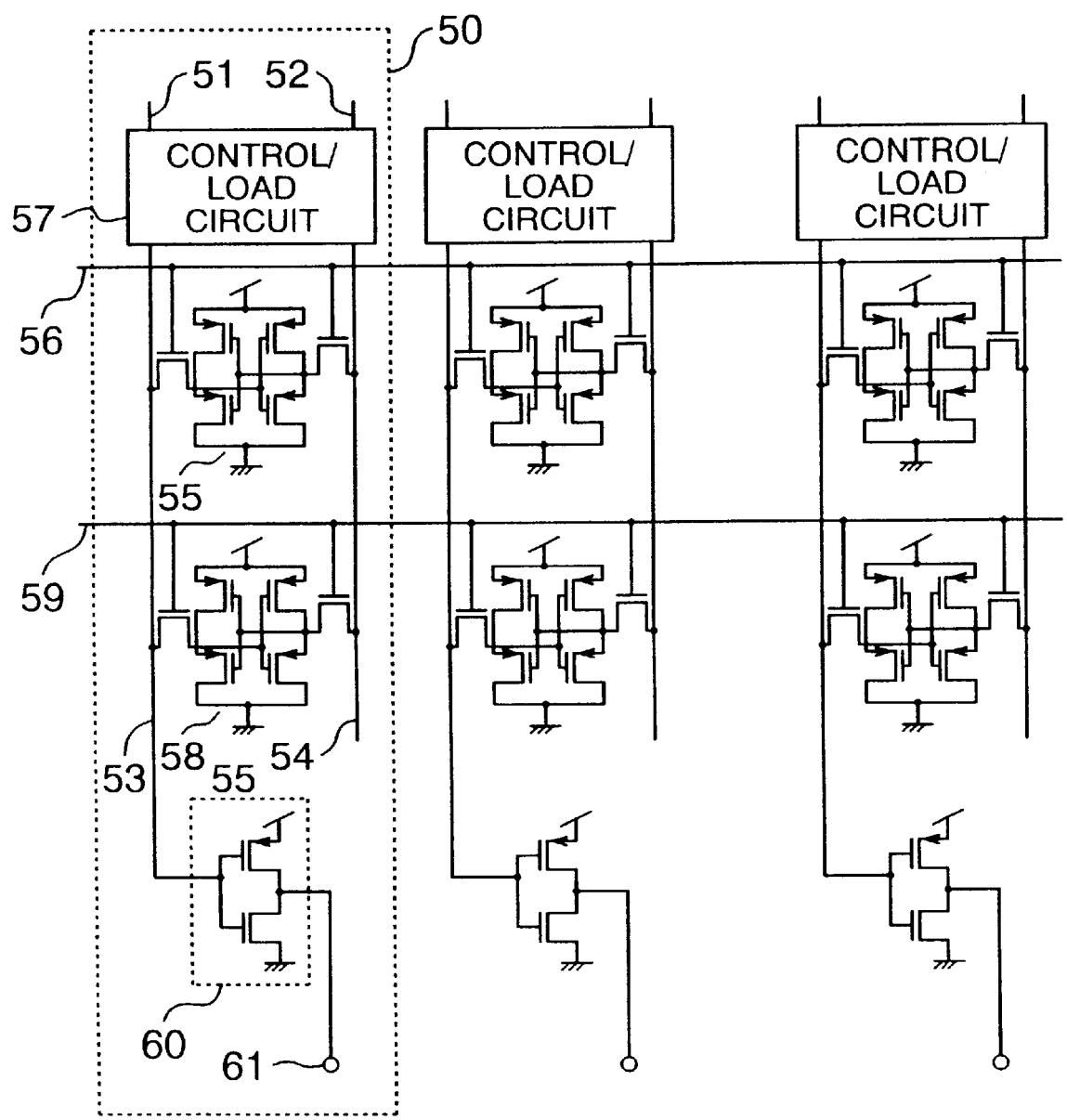
FIG. 3 is a circuit diagram showing the structure of an output data storage circuit of the invention.

FIG. 3 is a circuit diagram showing an embodiment of the output data storage circuit shown in FIG. 1. First, a circuit (circuit portion 50 surrounded by a broken line) for one bit of data will be described.

Output data to be stored is written in a memory cell 55 or 58 from a write control and load circuit 57 via signal lines 51 and 52. When a coincidence is detected by the precomparator shown in FIG. 1, one of word lines 56 and 59 is raised to a high potential and the stored data in the memory cell is output via a sense circuit (represented by a simple inverter 60 in FIG. 3) from a terminal 61. The circuit 50 surrounded by the broken line is provided in parallel as many as the number of bits of output data. In this example, although two sets of output data are used, the number of output data sets may be expanded easily by disposing memory cells in parallel. About four sets may be suitable in practical use.

Figure 4:
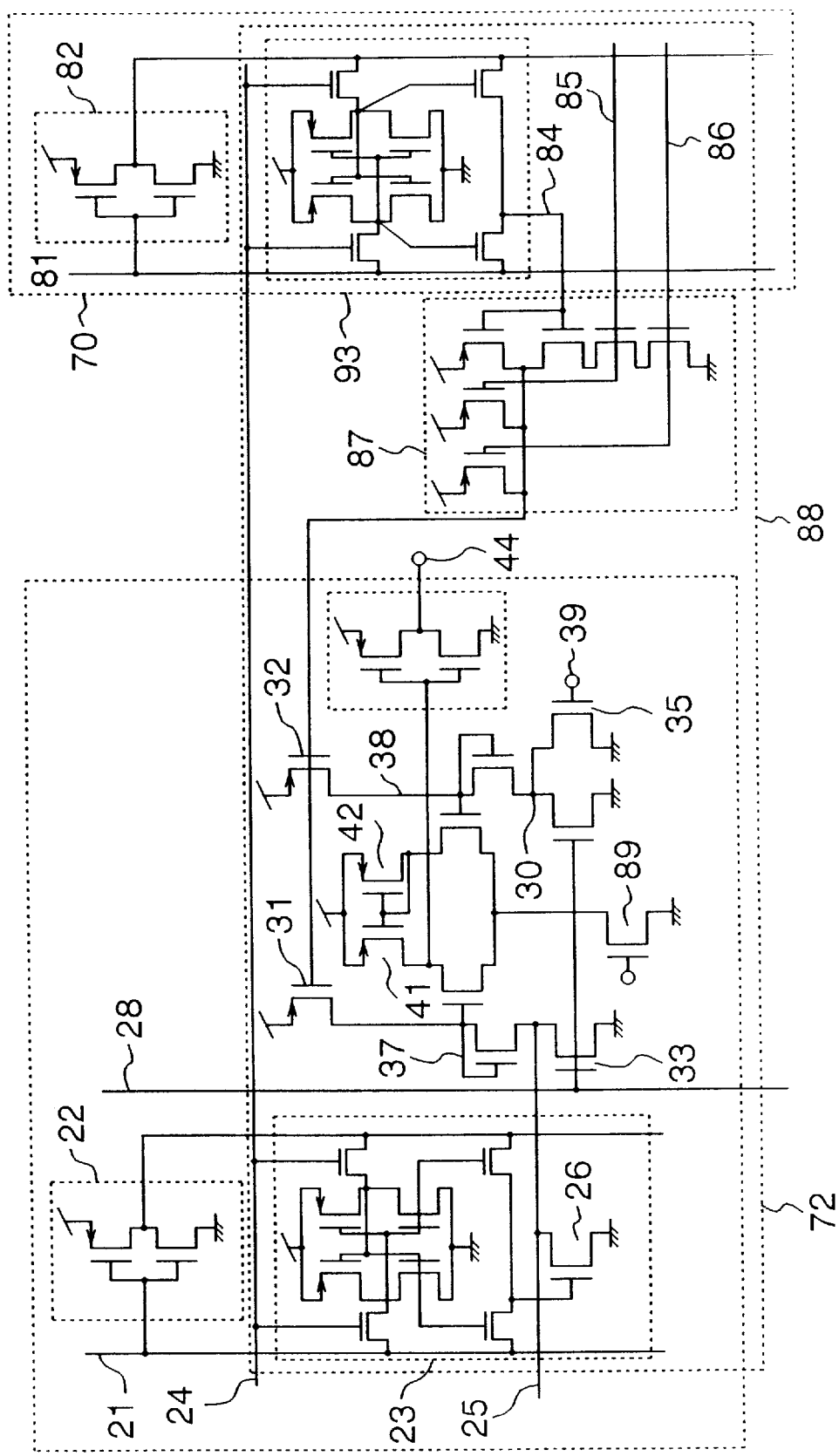
FIG. 4 is a circuit diagram showing the structure of a CAM unit of the invention.

FIG. 4 is a circuit diagram showing an embodiment of the CAM units 1 and 2 shown in FIG. 1. A circuit 70 at the right side surrounded by a broken line operates in a similar manner to the circuit 20 shown in FIG. 2. Specifically, as an input VA is supplied to a terminal 81, its complementary signal is generated by an inverter 82 to compare the input VA with data stored in a memory cell 83. In this case, the comparator circuit is designed to set a high potential at a terminal 84 when data coincidence is detected. Three circuits same as the circuit 70 are disposed in parallel to send the same signal also to terminals 85 and 86. These three signals are input to a three-input NAND gate 87 which outputs a ground potential only when all the comparison circuits detect coincidence.

This signal is supplied to P-type MOSFETs 31 and 32 which supply a constant current. If this signal 25 is inverted by an inverter and supplied to a MOSFET 89, the constant current flows and power is supplied from P-type MOSFETs 31 and 32 only when the data in the CAM unit 2 becomes coincide whereas power is not consumed if the data in the CAM unit 2 does not become coincident. Namely, by divisionally using the comparator circuits, the comparison result is generated at high speed. In accordance with the comparison result, the comparison circuits are operated to configure the TLB circuit of high speed and low power consumption.

Figure 5:
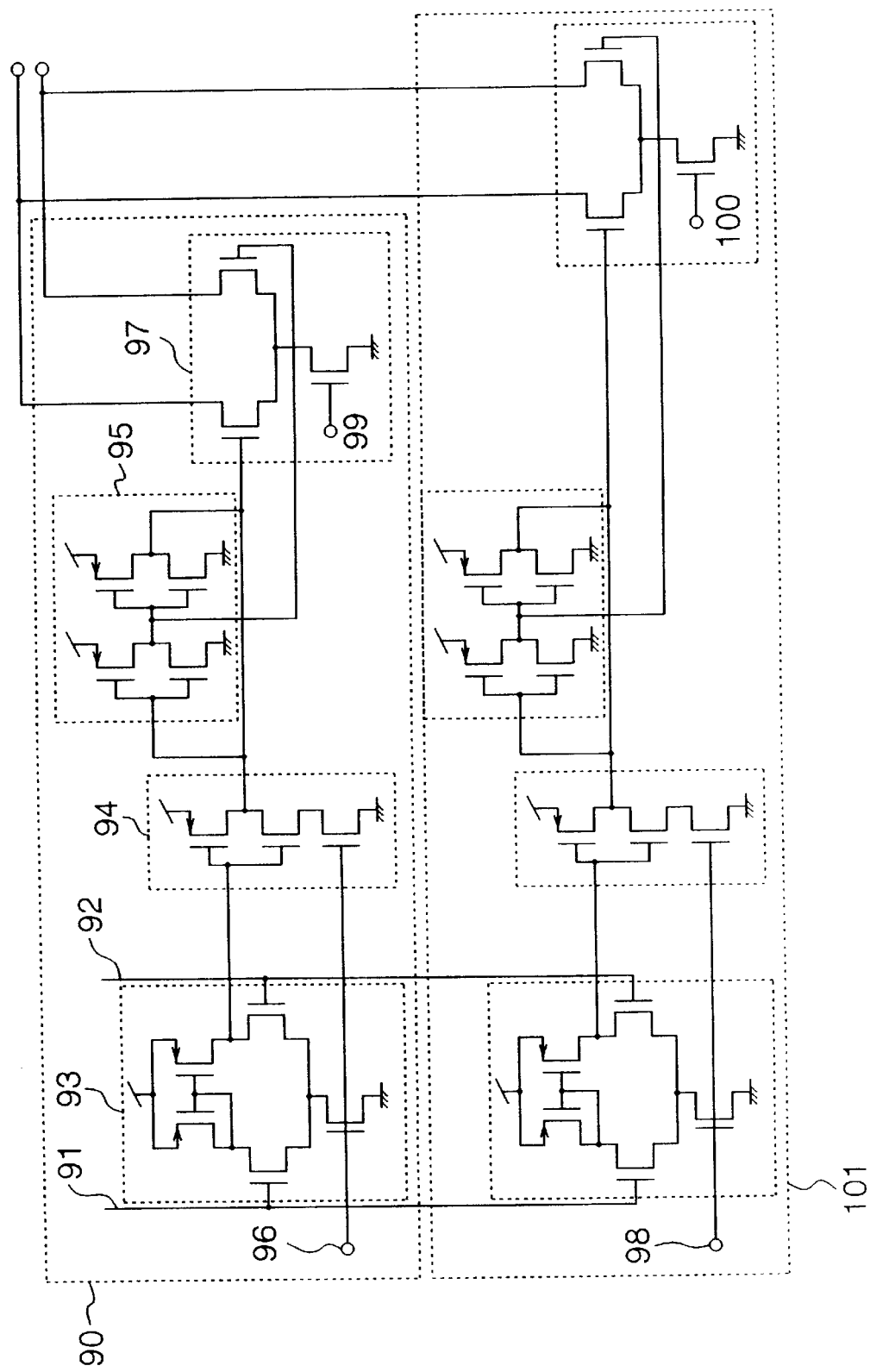
FIG. 5 is a circuit diagram showing the structure of the output data storage circuit and a selector of the invention.

FIG. 5 shows another embodiment of the output data storage circuit and a selector shown in FIG. 1. In this embodiment, the sense and output circuit and selector circuit shown in FIG. 1 are included. A circuit 90 is the same as a circuit 101, two sets of output data being stored in these circuits. Reference numerals 91 and 92 represent data lines for reading data in memory cells of the data RAM unit shown in FIG. 1. As the stored data is read in accordance with the results obtained at the CAM units 1 and 2, a signal having a potential difference of several hundreds mV is generated across the data line pair 91 and 82. This signal operates a differential amplifier 93 with the high potential being applied to terminals 96 and 99, and is amplified by an inverter 94 so that data is stored in a latch circuit 95 and at the same time a differential circuit 97 outputs differential current signals. At this time, if the potential at terminals 98 and 100 of the circuit 101 is the ground potential, data in the circuit does not influence an output of the circuit 90. With this circuit arrangement, by only adding the latch circuit 95 and differential circuit 97 to the output circuit, it is possible to configure the output data storage circuit, sense circuit, output circuit, and selector circuit. The terminals 99 and 100 take the high potential upon reception of the result obtained at the pre-comparator circuit, and the terminals 96 and 98 are control terminals used for newly writing the data stored in the data RAM unit in the output data storage circuit when the result obtained at the pre-comparator circuit indicates non-coincidence.

The data RAM unit is a widely used memory circuit, and so the description thereof is omitted.

The TLB circuit has been described above. The coincidence-detecting circuit of this invention can be used as a cache memory or as a general associative memory (content addressable memory CAM) circuit.

Although the structure and circuit diagrams of the CAM circuit have been described above, the following structure and circuit may be applied.

As memory cells built in the comparator 20 circuit, other types of memory cells may be used, for example, a memory cell using ten MOSFETs described in J. of Solid State Circuits Vol. 20, pp. 951–957 (1985), a memory cell using a circuit constituted of PMOS and NMOS described in JP-A-63-308796, a memory cell using nine MOSFETs and diode-connected MOSFETs described in J. of Solid State Circuits Vol. 5, pp. 208–215 (1990), and the like. In place of diode-connected MOSFETs, pn-junction type or Schottky barrier type diodes may also be used, or bipolar transistor using the substrate as its collector ay also be used.

Figure 8:
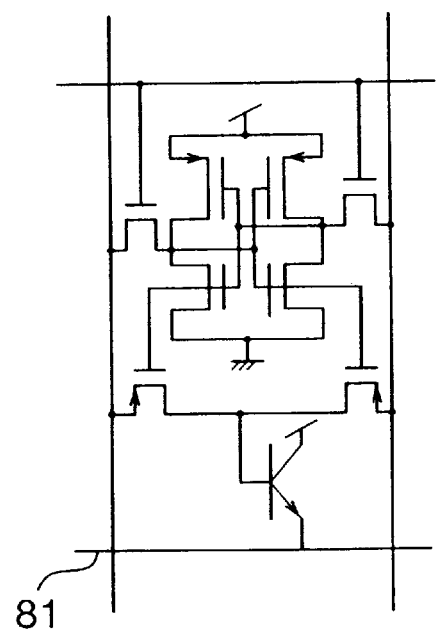
FIG. 8 is a diagram showing the structure of a memory cell built-in with bipolar transistors of the invention.
Figure 9:
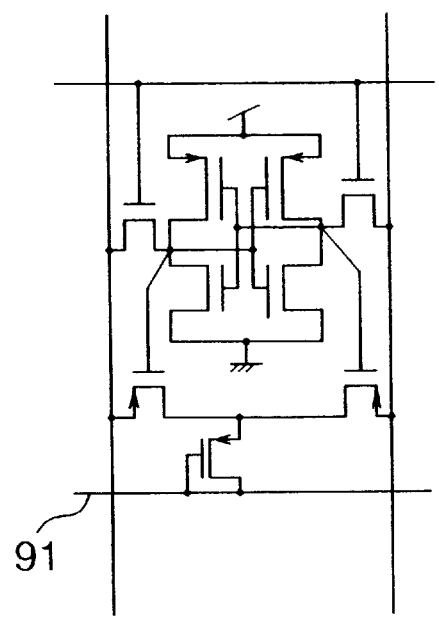
FIG. 9 is a diagram showing the structure of a memory cell built-in with MOSFETs of the invention.

A circuit with the smallest memory cell area was that shown in FIG. 8 (an example of a memory cell with a built-in bipolar transistor) in which the emitter is connected to a detecting signal line 81, a PMOS substrate is used as the collector, and a PMOS drain is used as the base. This reduced area results from a reduced number of electrode holes because of their composite structure. A circuit shown in FIG. 9 (an example of a memory cess with a built-in MOSFET) was able to reduce the memory cell area in which a diode is constituted by connecting the gate and drain to a coincidence-detecting signal line 91. This reduced area results from a use of substantially the same electrode hole because the gate and drain are shorted. The feature of this circuit resides in that it is made of only MOSFETs without new additional devices and the area can be reduced.

Figure 10:
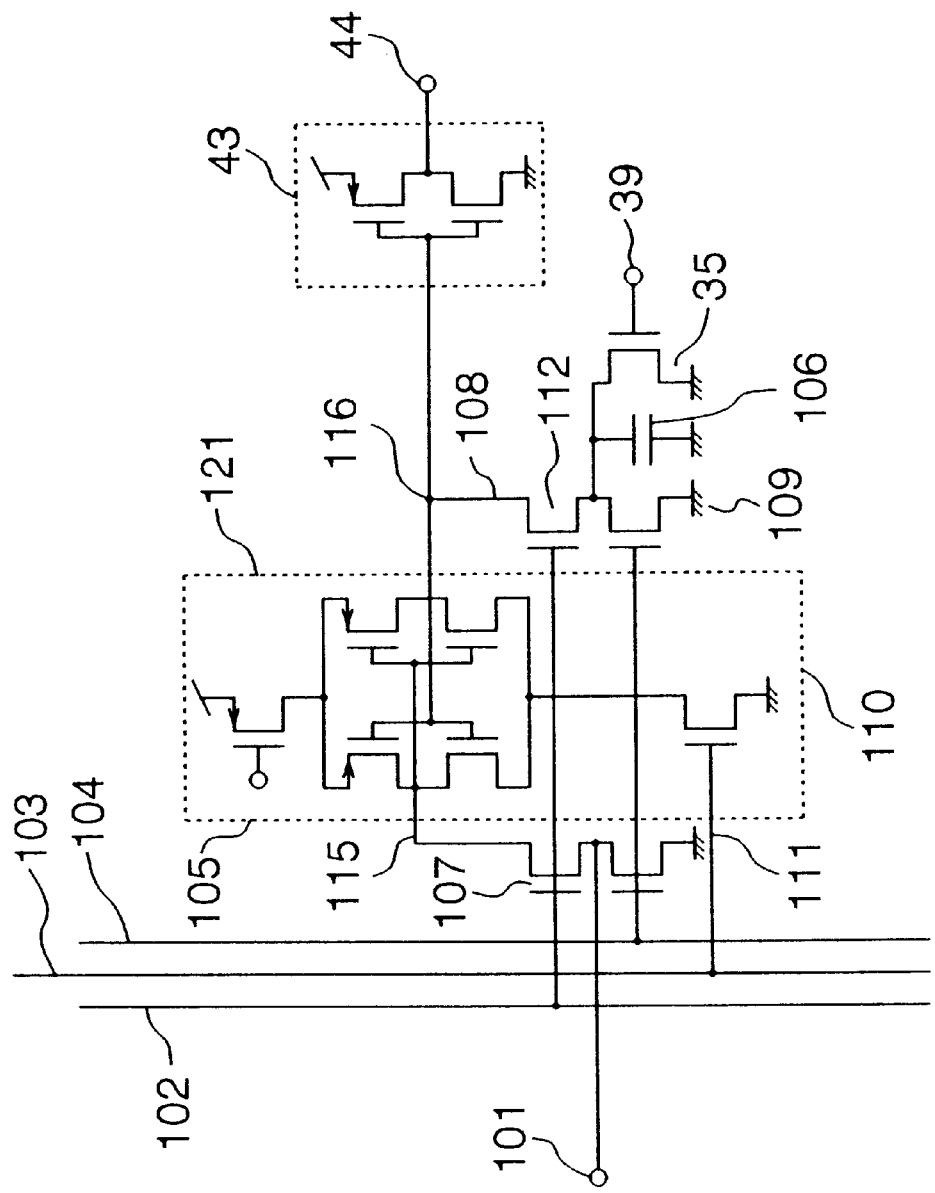
FIG. 10 is a diagram showing a signal generator circuit and a sense amplifier circuit of the invention.

A signal generator circuit and a sense amplifier are shown in FIG. 10, which have a low power consumption and a small number of devices reducing the device occupied area. The circuit operation will be described. A terminal 101 is an input terminal of a signal indicating the comparison result, and is connected, for example, to the signal line 25 shown in FIG. 4. A signal line 104 is an equalizing signal line for making the coincidence-detecting signal line input terminal 101 and a reference terminal 112 have the same potential or ground potential, the potential at this signal line 104 changing from a high level to the ground level at the start of coincidence detection. A signal line 102 is used for supplying a potential which operates MOSFETs 107 and 108 as current sources. This signal line 102 is set so that a predetermined current is supplied when the potentials at the terminals are the ground potential. As will be later described, this potential is set to the ground potential during the period not associated with the essential operation, in order to reduce consumption power.

If the potential at the signal line 102 is controlled by using an output of the circuit 88 shown in FIG. 4, the power consumption can be lowered more. Reference numeral 103 represents a power control terminal for supplying a power to a latch type sense amplifier. When the potential at this terminal is set to a high level, the sense amplifier starts its operation. A predetermined potential is applied to a terminal 105 to always turn on the transistor so that the potentials at terminals 115 and 116 are maintained approximately at a positive power source level while the potential of the equalizing signal lines is maintained at a high level. First, the operation starting from the detection of a coincidence signal will be described. As the detection starts, the potential of the equalizing signal line 104 first takes the ground potential so that MOSFETs 109 and 111 turn off and the potentials at the terminals 101 and 112 start rising because of the current supplied from MOSFETs 107 and 108. If all MOSFETs on the detecting signal line connected to the terminal 101 are in a turn-off state, the supplied current charges the parasitic capacitor of the coincidence-detecting signal line and the potential rises. This potential rise reduces the current flowing through MOSFETs. Similar to the structure shown in FIG. 4, connected to the reference potential generating terminal 112 used for coincidence detection are a capacitor 106 having the same capacitance as the detecting signal line and a MOSFET 35 with a potential supply terminal 39 for supplying a current which flows when only one detecting MOSFET becomes conductive. This MOSFET 35 makes a rise in the potential at the terminal 112 smaller than that in the potential at the terminal 101, and makes a reduction in the current flowing through MOSFET 108 smaller than that in the current flowing through MOSFET 107. Namely, the potential at the terminal 116 becomes lower than that at the terminal 115. As above, when the potential at the signal line 103 is changed to the high level under such a condition that a potential difference is generated between both the terminals, the sense amplifier starts its operation. Therefore, the potential at the terminal 115 rises to the positive power source potential, and the potential at the terminal lowers to the ground potential. This signal is supplied to the word line via the output circuit 43. The operation when the comparison result shows non-coincidence will be described. The feature of this circuit resides in a latch type of the sense amplifier so that in a steady state, i.e., in a state of an output fixed to a high or low level, power is not consumed ensuring low power consumption. Furthermore, as the signal line 102 turns off MOSFETs 107 and 108, the wiring and dummy capacitors connected to the terminals 101 and 108 are not charged by the power source and the potentials of the capacitors are not raised so that the charge current lowers and hence the power consumption is reduced. In this example, although the signal line 102 directly turns off and on MOSFETs 107 and 108, these MOSFETs may be connected in series to turn them on and off.

Figure 6A:
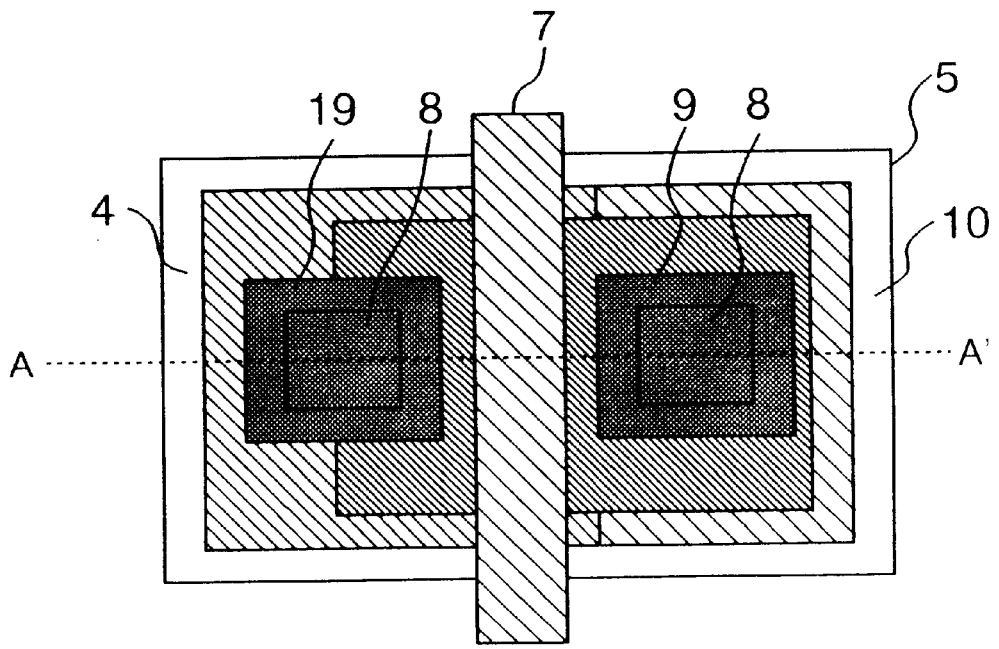
FIGS. 6A and 6B are diagrams showing the structure of a MOSFET most suitable for the manufacture of a semiconductor device of the invention.
Figure 6B:
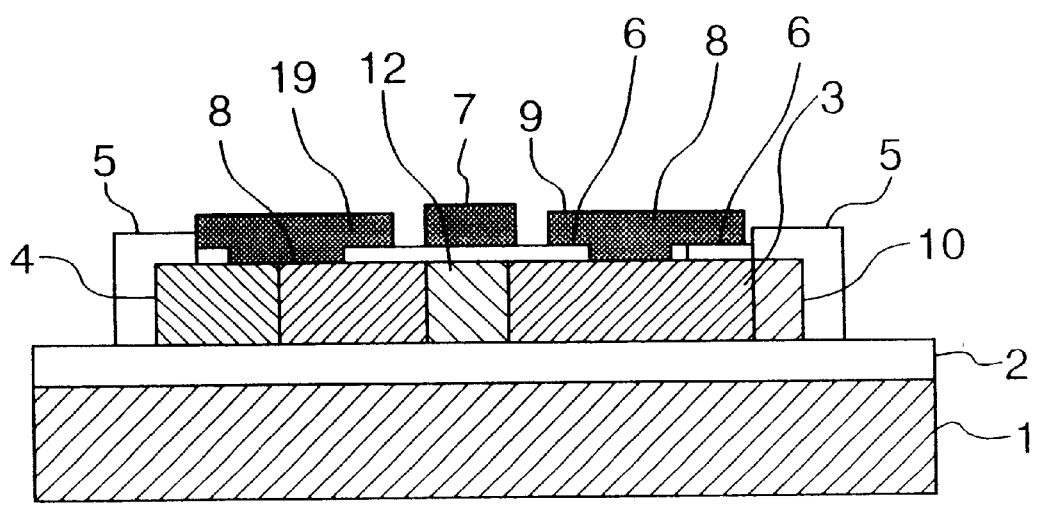

FIGS. 6A and 6B are diagrams showing the structure of an N-type MOSFET most suitable for speeding up the operation of the coincidence-detecting circuit of this invention. FIG. 6A is a plan view and FIG. 6B is a cross sectional view taken along line A—A' of FIG. 6A. In these drawings, reference numeral 1 represents a silicon substrate and reference numeral 2 represents a silicon oxide film which electrically isolates the substrate 1 and a silicon layer 3. Reference numeral 7 represents a gate electrode of a MOSFET. In the silicon film 3 surrounded by an oxide film 5, a P-type region 4 is formed surrounding a source region, the P-type region 4 being the same conductivity type as the substrate 1. The region 4 extends toward the drain region. This is because a margin is formed in order to make the region reach the gate during the semiconductor device manufacture. With this margin, the region 4 is restricted to enter the drain region. This is preferable in order not to increase parasitic capacitance and leak current. Reference numeral 8 represents contact holes for depositing electrode metals 9 and 19 on the silicon film. The region from just under the gate 7 to the electrode 8 is coupled by the drain/source region and the P-type silicon region 4 of the opposite conductivity type. Therefore, the potential of the silicon film 12 just under the gate is fixed to the potential of the electrode 19. It is therefore possible to control the threshold value, which is the main parameter determining the MOSFET characteristics, by changing the impurity concentration of the silicon film just under the gate electrode. The feature of the structure shown in FIG. 6 resides in that the side wall and top surface of the region 4 is covered with the oxide film 5 thicker than the gate oxide film. This thick oxide film makes it difficult to form a channel in the surface layer of the region 4, even if the channel (also called an inversion layer) conducting the drain and source is formed upon application of a positive potential to the gate 7. Therefore, the conduction in the region 4 can be maintained and the threshold voltage can be controlled precisely.

A method of forming the region 4 and oxide film 5 will be described with reference to FIGS. 7A to 7E.

Figure 7A:
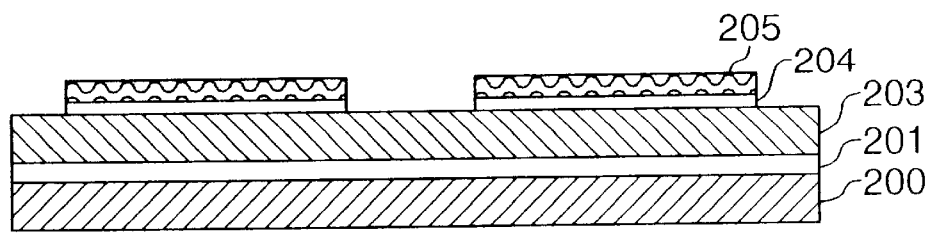
FIGS. 7A to 7E are diagrams illustrating the processes of manufacturing a semiconductor device of the invention.
Figure 7B:
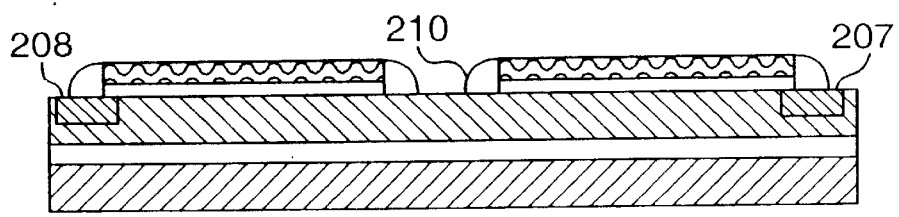
Figure 7C:
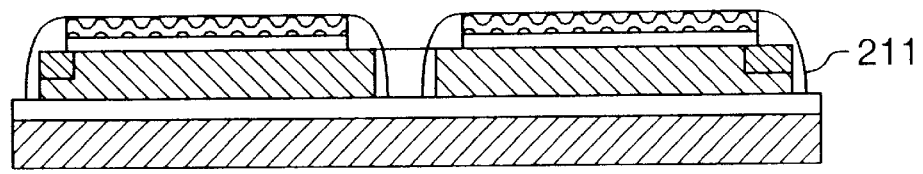

FIG. 7A shows the cross sectional structure in which a silicon substrate 200 is formed with a silicon film 203 via a silicon oxide film 201 to form a so-called SOI wafer, on this wafer, an oxide film 204 and a nitride film 205 are deposited to a thicknesses of 5 nm and 20 nm to leave them only on MOSFET areas. Next, regions 207 and 208 corresponding to the region 4 shown in FIGS. 6A and 6B are formed near the source regions of a PMOSFET and an NMOSFET by ion implantation using a mask to thereby form an oxide film 210 on the side walls of the nitride film 105, this structure being shown in FIG. 7B. Next, the silicon film 3 is removed by anisotropic dry etching, and an oxide film 211 is formed. This oxide film 211 may be formed through heat treatment under an oxidizing atmosphere or it may be formed by leaving an oxide film only on the side walls through anisotropic dry etching. The cross sectional structure at this stage is shown in FIG. 7C.

Figure 7D:
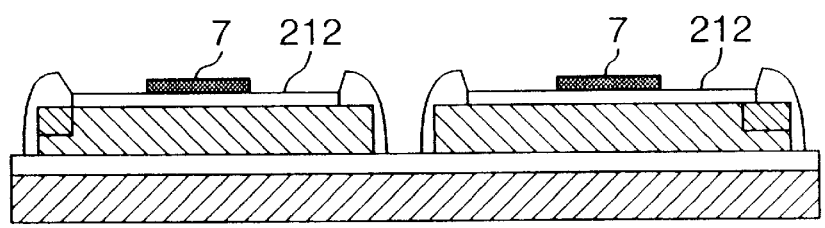
Figure 7E:
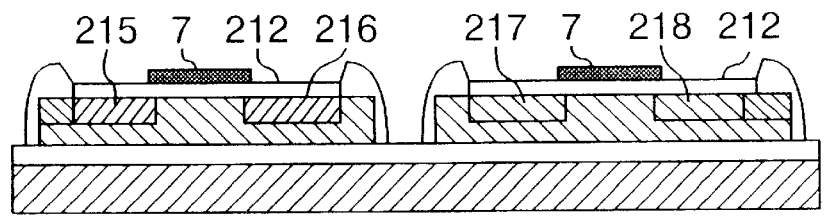

Next, after the nitride film 205 and oxide film 204 are removed, an oxide film 212 is again deposited to a thickness of 5 nm to form a gate electrode 7. The structure at this stage is shown in FIG. 7D. Next, a drain 216 and a source 215 of P-type MOSFET and a drain 217 and a source 218 of N-type MOSFET are formed through ion implantation to form the structure shown in FIG. 7E. The following processes are generally the same as conventional CMOS LSI manufacture processes, and so the description thereof is omitted. With the above method, the region 4 shown in FIGS. 6A and 6B can be formed in a very narrow region around the silicon film 203.

An embodiment of the invention will be further described with reference to the accompanying drawings.

An example of the structure of TLB using the coincidence-detecting circuit of this invention shown in FIG. 1 will be described. The insides of the pre-comparator circuit, output data storage circuit, CAM unit (1) and CAM unit (2) are formed with memory cells and CAM cells in a matrix format to constitute an array structure. At each row, data to be compared and data to be output are stored. At each column of a memory cell, an address input line is provided. An input address is a virtual address (hereinafter represented by VA) which is supplied to the pre-comparator circuit and to the CAM units 1 and 2. If the pre-comparator circuit detects a coincidence, a Hit signal is generated and an output data storage circuit outputs stored data. Although not shown in FIG. 1, the output data storage circuit has a circuit for stopping a power supply to a coincidence signal generator circuit between the CAM units (1) and (2) when the Hit signal is generated. If the pre-comparator circuit confirms non-coincidence, a power is supplied to the coincidence signal generator circuit, and if the CAM units 1 and 2 confirm a coincidence between VA and data in the CAM units, data in the data RAM unit is output via a sense circuit and an output circuit. The function of the CAM unit 2 will be described now. In the CAM unit 2, a signal of about three bits among the input address is supplied to the comparator circuits which check coincidence/non-coincidence at high speed. In accordance with this check result, a power is supplied to the coincidence-detecting circuit to check coincidence/non-coincidence relative to the data of the CAM unit (1). In this manner, a power is supplied only to the row which the CAM unit (2) detected a coincidence. Therefore, if an input address is in quite a random state, the number of coincidence signal generator circuits supplied with the power is reduced to ⅛ the total number (½ raised to the third power because of 3-bit comparison). Namely, the consumption power of the coincidence signal generator circuits can be reduced by ⅛. It is possible to distribute part of the considerably reduced power to the coincidence signal generating circuit to thereby achieve high speed operation. Since only an operation of reading data stored in advance is executed when the pre-comparator circuit detects a coincidence, the data can be output at high speed.

Figure 11:
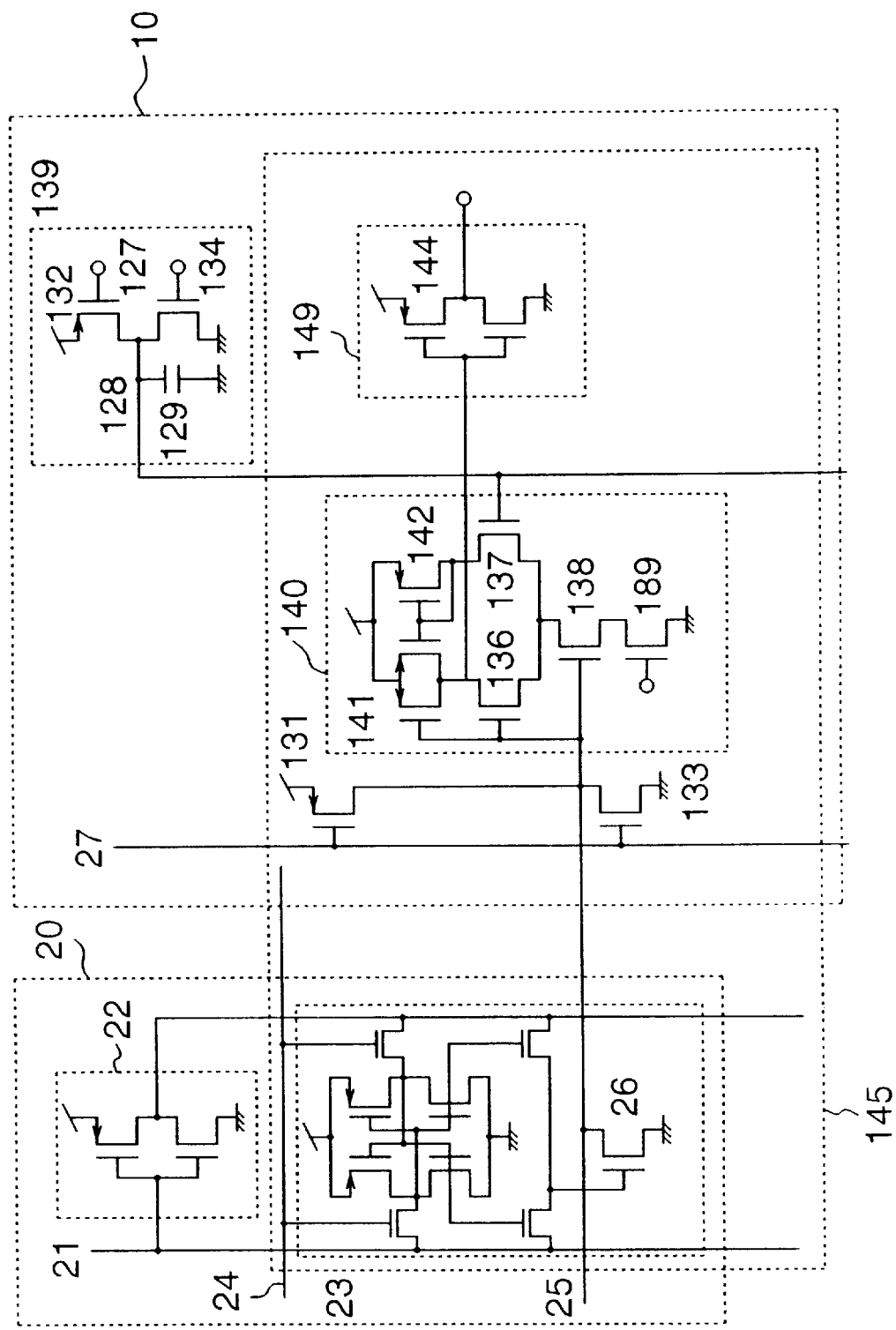
FIG. 11 is a circuit diagram showing an embodiment of the invention.

FIG. 11 shows an example of the circuit diagram of the pre-comparator circuit (FIG. 1). Reference numeral 21 represents one bit of VA. A circuit 22 surrounded by a broken line is an inverter 21 for generating a complementary signal. A circuit 23 surrounded by a broken line is a memory cell (CAM cell) having a comparator circuit. Reference numeral 24 represents a word line which operates to store data on the bit line 21 in the CAM cell 23. The circuits for selecting and driving a word line are not shown. Such circuits have a structure widely used and the description thereof is considered unnecessary. The circuit described above (circuit 20 surrounded by a broken line) corresponds to one bit of VA, and is provided in parallel as many as the number of bits of VA to be compared, to thereby constitute a column of the array of the CAM unit (1). Reference numeral 25 represents a coincidence-detecting signal line. A MOSFET 26 is designed to turn off when the input VA and the memory cell data are coincident. The coincidence-detecting signal line 25 is connected in parallel with MOSFET (corresponding to MOSFET 26) at each column of the input VA, and only when the all bits of the input VA and the stored data are coincident, the signal line 25 is disconnected from a ground terminal. Reference numeral 27 represents a signal line used for controlling a current to be supplied to the coincidence-detecting signal line 25, the signal line 27 being maintained at the ground potential when the current is supplied, The current is supplied which is generally the same as the current flowing from the P-type MOSFETs 131 and 132 to MOSFET 26 when the data is not coincident. Until the coincidence-detecting line current is supplied, the potentials of the signal lines 25 and 28 are maintained at the ground potential by MOSFETs 133 and 134, and the potentials of both the signal lines rise while MOSFET 133 is turned off and MOSFETs 131 and 132 are turned on. Of these signal lines, the potential of the coincidence-detecting signal line 25 with all data being coincident becomes highest, the potential of the reference signal line becomes next highest, the potential of the coincidence-detecting signal line with one data set being coincident becomes second next highest, and the potential rise of the signal line 25 becomes smaller as the number of coincident data sets increases, from the following reason. A rise of the signal line potential will be described. Each signal line has generally the same electrostatic capacitance (a dummy capacitor 129 is connected to the reference signal line to make the reference signal line have the same capacitance as the coincidence-detecting signal line). Therefore, when the same current Io is supplied from MOSFETs 131 and 132, a voltage rise dV/dt per unit time of each signal line is (I0–I1)/C where I1 is a current value flowing through the signal line of MOSFET 26, and C is a electrostatic capacitance of the signal line. Since the potential of the signal line is preset to the ground potential, a voltage is hardly applied to the drain of MOSFET 26 or 134 at the start of supplying the current Io. Therefore, the current flowing through MOSFET is smaller than the current I1 when a sufficiently large drain voltage is applied, and as the drain voltage rises, the current I1 increases and reaches a constant value. Accordingly, if Io and I1 are set generally equal, the potential of the signal line rises to about a half of the power supply voltage and takes a constant value. The gate voltage and width of MOSFET 134 for the reference voltage generation are designed so that about a half of the current I1 flows through MOSFET 134. In the coincidence-detecting circuit shown in FIG. 11, when the potential of the signal lines 25 and 128 exceeds the threshold voltage of N-type MOSFET 136 or 137 and the threshold voltage of MOSFET 138, current flows. However, if data is not coincident, the reference voltage terminal 128 takes a potential higher than the coincidence-detecting signal line 25, so that an output of the circuit 140 maintains a high potential MOSFET 189 is used for limiting a maximum current and its gate is applied with a potential allowing to flow a predetermined current. This MOSFET may be omitted. Current flowing through the circuit 140 surrounded by a broken line will be described. The signal line having a largest current is the signal line with coincident data and having a highest potential rise. However, data coincidence occurs on only one signal line or on no signal line. Therefore, the current flowing in such a case poses no problem in terms of power consumption. In contrast, signal lines with data non-coincidence are all of the remaining signal lines, and have the potential equal to or lower than that of the reference signal line. Therefore, when the potential of the reference signa line exceeds the threshold voltage of MOSFET 137, current will flow through almost all of the detecting circuits, increasing the total power consumption. From the view-point of lowering the power consumption, it is preferable that the potentials of the reference signal line 128 and the signal line with the data non-coincidence do not exceed the threshold voltage greatly. The potentials of the reference signal line 128 and the signal line with the data non-coincidence are determined from the relationship between the current supplied by MOSFETs 131 and 132 and the current flowing through MOSFET 26 being conductive during non-coincidence and MOSFET 134 being always conductive. As described above, the potentials reach about a half of the power source voltage and becomes constant when both the currents are equal. This potential abruptly lowers when the supply current Io is reduced. However, since a reduction of the supply current Io prolongs the detection time, it is preferable to set the potential high from the viewpoint of operation speed. There is a trade-off between the operation speed and the consumption power. MOSFET 138 is provided to eliminate this trade-off, and is devised by paying attention to the following fact. The potential rise of the coincidence-detecting signal line 25 quickly lowers as the number of non-coincidence data sets increases. By paying attention to the fact that most of data have two or more non-coincident data sets, MOSFET 138 is serially connected to the current limiting MOSFET 189 to form a circuit which flows no current when a plurality of data sets are not coincident. With this approach, current of the circuit 140 flows only through the row with data coincidence and through the row with only one data non-coincidence, so that the average power consumption of this circuit can be reduced considerably. The reference signal generator circuit (circuit 139 surrounded by a broken line) and the reference signal line 128 are shared by a plurality of sense circuits 140. This sharing reduces the power consumption of the reference signal generator circuit, and the power supply to the coincidence signal generator circuit is increased correspondingly to improve the operation speed.

The circuit 145 surrounded with a broken line has been described above. This circuit is provided 4 to 8 rows for the pre-comparator circuit and 64 to 128 rows for the CAM unit (a) for the comparison with the input VA, and the data stored in the data RAM unit (refer to FIG. 1) corresponding to a coincident data set is output.

Figure 12:
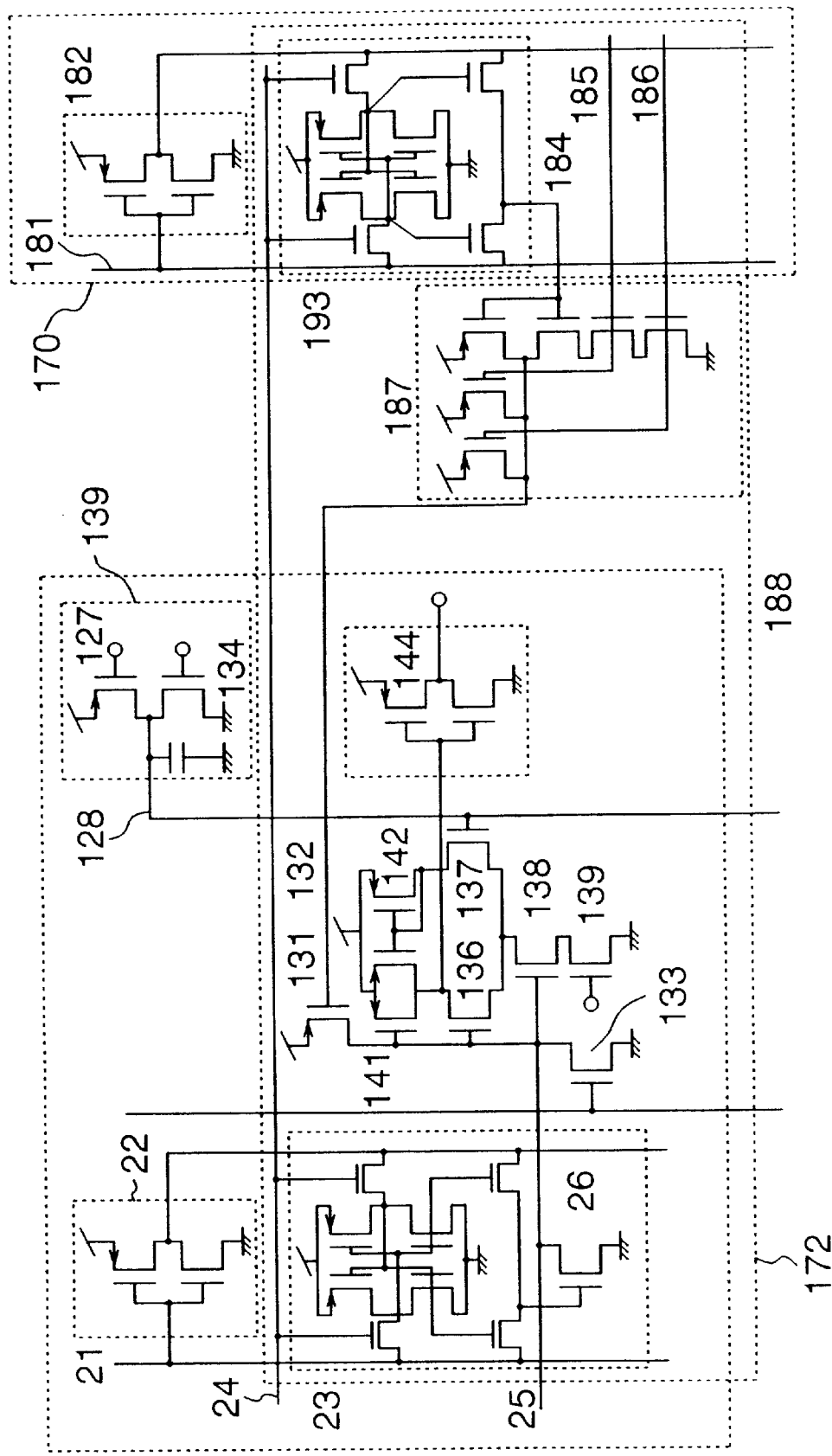
FIG. 12 is a circuit diagram showing an embodiment of the invention.

FIG. 12 is a circuit diagram showing an embodiment of the CAM units 1 and 2 shown in FIG. 1. A circuit 170 at the right side surrounded by a broken line operates in a similar manner to the circuit 20 shown in FIG. 11. Specifically, as an input VA is supplied to a terminal 181, its complementary signal is generated by an inverter 182 to compare the input VA with data stored in a memory cell 193. In this case, the comparator circuit is designed to set a high potential at a terminal 184 when data coincidence is detected. Three circuits same as the circuit 170 are disposed in parallel to send the same signal also to terminals 185 and 186. These three signals are input to a three-input NAND gate 187 which outputs a ground potential only when all the comparison circuits detect coincidence. This signal is supplied to a P-type MOSFET 131 through which a constant current flows to supply a power only when the data in the CAM unit (2) becomes coincident and not to supply a power when the data in the CAM unit (2) is not coincident. Namely, by divisionally using the comparator circuits, the comparison result is generated at high speed. In accordance with the comparison result, the coincidence signal generator circuits are operated to configure the TBL circuit of high speed and low power consumption. Similar to the circuit shown in FIG. 11, the reference signal line 128 and reference signal generator circuit 130 shown in FIG. 12 are shared by a plurality of rows. This sharing can reduce the consumption power of the CAM unit (1) having a number of rows.

Figure 13:
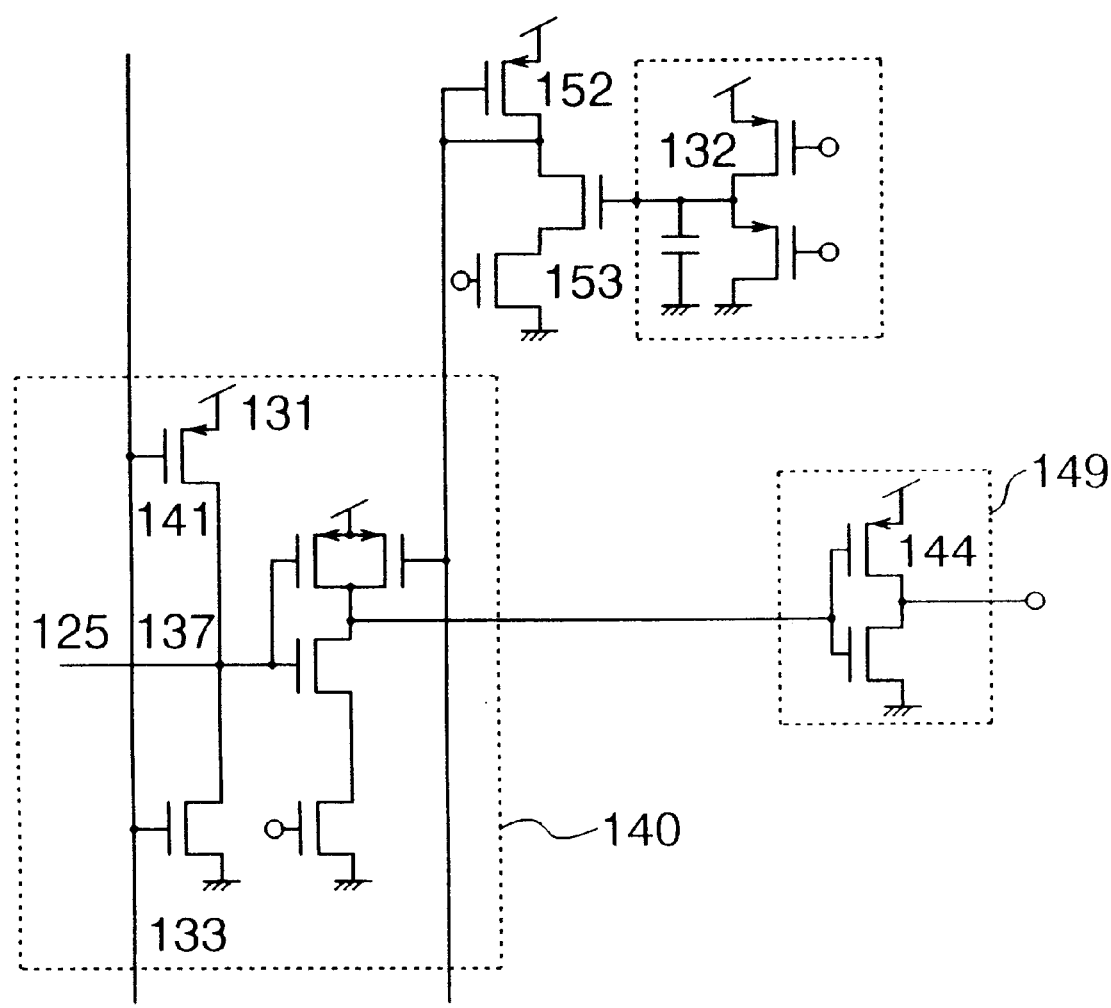
FIG. 13 is a circuit diagram showing an embodiment of the invention.

FIG. 13 shows another embodiment of the circuit 10 surrounded by the broken line in FIG. 11. MOSFETs 142 and 137 and the like provided for each row in the circuit 10 are changed to a circuit with MOSFETs 152 and 153 and the like shared by each row to simplify the circuit. This sharing can reduce the number of devices constituting the coincidence-detection circuit 140 at each row to about a half.

As the potential of the coincidence-detecting signal line 125 with data coincidence rises, an output of the sense amplifier 140 lowers and is input to a buffer circuit 149. An output of the buffer circuit is coupled to the word line of the data RAM array so that the potential of this word line is raised to read the data.

The data RAM unit is a widely used memory circuit, and so the description of its structure and operation is omitted.

The TLB circuit has been described above. The coincidence-detecting circuit of this invention can be used as a cache memory or as a general associative memory (content addressable memory CAM) circuit.

Although the structure and circuit diagrams of the CAM circuit have been described with reference to the drawings, the following structure and circuit may be applied.

As memory cells built in the comparator circuit, other types of memory cells may be used, for example, a memory cell using ten MOSFETs described in J. of Solid State Circuits Vol. 20, pp. 951–957 (1985), a memory cell using a circuit constituted of PMOS and NMOS described in JP-A-63-308796, a memory cell using nine MOSFETs and diode-connected MOSFETs described in J. of Solid State Circuits Vol. 5, pp. 208–215 (1990), and the like. In place of diode-connected MOSFETs, pn-junction type or Schottky barrier type diodes may also be used, or bipolar transistor using the substrate as its collector may also be used.

Figure 14:
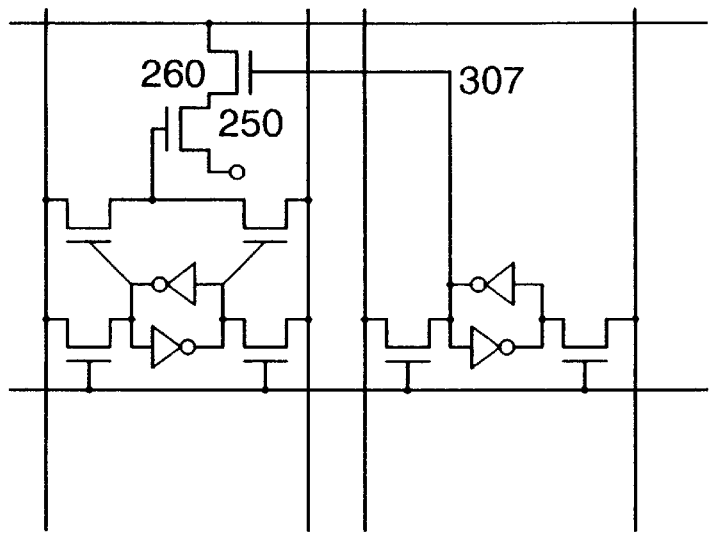
FIG. 14 is a circuit diagram incorporated from another invention.

FIG. 14 is a diagram shown in the Patent Publication of JP-A-1-220293 disclosing an example of the structure of TLB capable of dealing with variable length data. A CAM cell of this structure can obviously be applied to the present invention. Studies of this structure resulted in new founding as to the design and layout position of MOSFET 260 shown in FIG. 14. First founding is a reduction of a coincidence-detecting current flowing through the CAM cell and a corresponding prolonged coincidence-detecting time. Although the operation of conduction/non-conduction of MOSFET 260 is controlled by a variable length designating bit, the current reduces more than a conventional CAM cell because the current flows through the turned-on MOSFET 260 via a serially connected MOSFET 250. From this reason, in order not to increase the delay time, the drive ability for MOSFETs is desired to be increased. For example, the gate widths of all MOSFETs may be widened correspondingly. However, in this case, the load of the input VA data line becomes large so that the drive time is prolonged and the consumption power is increased. Widening the gate width of only MOSFET 260 has been studied. It has been found that if the gate width of MOSFET 260 is designed to be about 1.5 times that of MOSFET 250, the current can be reduced considerably. Although the area of the CAM cell increases correspondingly as the gate width of MOSFET 260 is widened, it has been found that this area increase is very small and the load on the VA input data line hardly increases. A second founding obtained from the above studies is an advantage of provision of a single MOSFET 260 for a plurality of CAM cells, from the viewpoint of both the area and electrical characteristics. Specifically, if the comparison result between the input VA data and data in the CAM cell indicates non-coincidence, the minimum level of a signal indicating "non-coincidence" corresponds to a conduction state of MOSFET in the CAM cell, for example, of one MOSFET 250 shown in FIG. 5. Namely, it is sufficient if one MOSFET (e.g., MOSFET 260) is provided in common for a plurality of CAM cells. Particularly with the method of generating a coincidence-detecting signal by supplying a constant current as described in this invention, the supply current is limited so that the effects of provision of the single MOSFET can be enhanced further. This sharing of the single MOSFET reduces the area occupied by the circuit.

Figure 15:
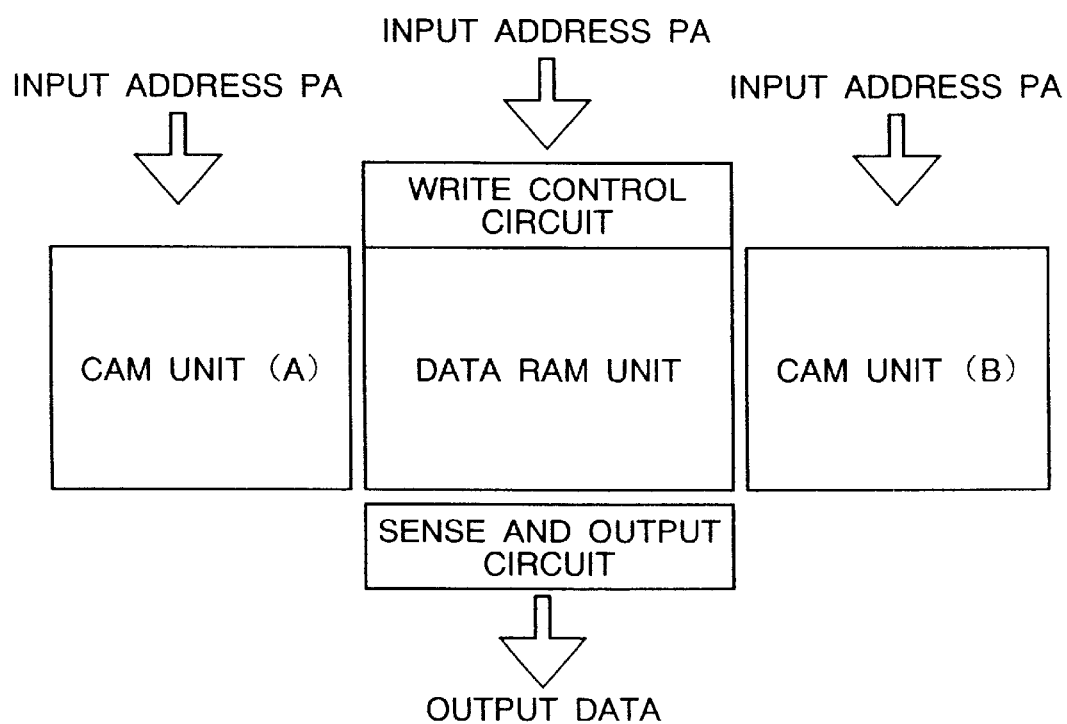
FIG. 15 is a block diagram showing the structure of another TLB circuit of the invention.

FIG. 15 shows an example of the structure of a novel TLB of this invention.

A conventional TLB is provided with a function of transforming a virtual address VA into a real address PA. In this case, if there is a possibility of alias that a plurality of VAs use in common a single PA, it becomes necessary when VA and PA data are updated to provide an update mechanism for updating control data added to a shared PA or a mechanism for prohibiting sharing. The structure of TLB shown in FIG. 15 realizes such a mechanism more simply and provides efficient use of data. Specifically, the conventional TLB is configured laying emphasis upon transformation from VA to PA, whereas TLB shown in FIG. 15 is configured so that VA can be identified also from PA, and all VA data using one PA can be read or rewritten. TLB having such a structure is free of complicated mechanism even data is used in duplicate and the data can be used without disrtcarding it.

The details of this TLB will be given with referent to FIG. 15. Both arrays of a CAM (A) and a data RAM have the same structure as a conventional TLB. The feature of the structure of this invention is a CAM (B). A CAM cell of the CAM (B) stores PA data corresponding to VA data. When data in the RAM array is rewritten, the PA data to be rewritten is input to the CAM (B) as the comparison data. For the row with a coincidence, data is written via a RAM write circuit by raising the potential of the corresponding word line of the RAM array. At this time, data for the CAM cell of the CAM (B) is written also by raising the potential of the word line. With this arrangement, even if PA is shared, only the PA shared by VAs is rewritten so that a specific protection mechanism is not necessary, and the data otherwise discarded conventionally can be used. The data write time can therefore be shortened.

Although the above description is directed to the conventional TLB, it is obvious that this structure is applicable to TLB of this invention, realizing high speed and low power consumption. It is also apparent that these mechanism and structure can be applied to a cache memory using a VA address and the like.

Figure 16:
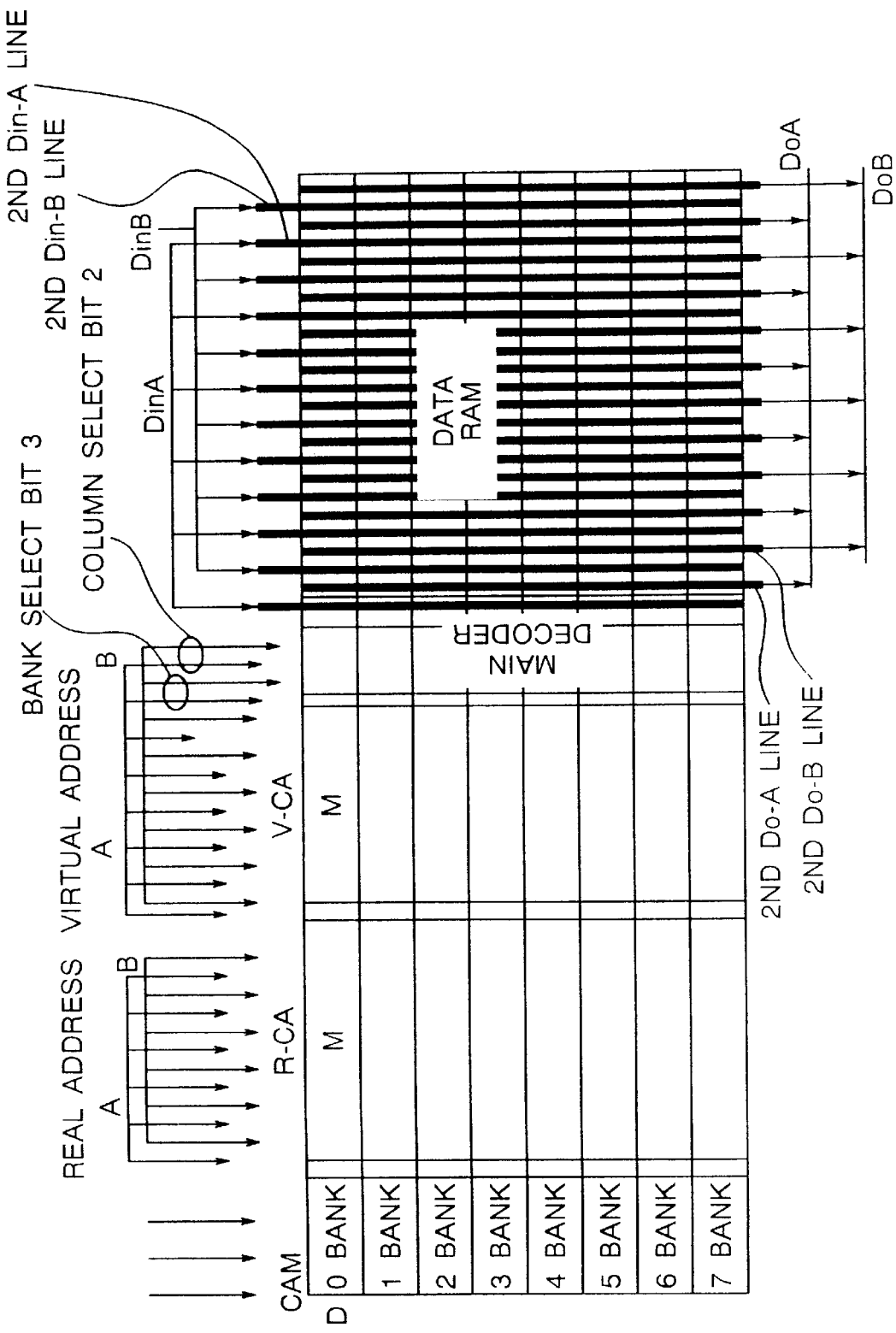
FIG. 16 is a block diagram showing the circuit structure of a cache memory of the invention.

FIG. 16 shows the structure of a novel circuit applied to a cache memory of this invention. The details of this circuit will be given with reference to FIG. 16. The cache memory shown in FIG. 16 is constituted of a data RAM unit (Data RAM) storing data to be read, a virtual address CAM (V-CAM) for designating a row of the data RAM to be read, a real address CAM (R-CAM) for verifying that the designated row of the data RAM is correct, a CAM decoder (CAM-Dec) for writing data in CAM, selectors (provided for each bank) for selecting real addresses A and B and virtual addresses A and B, and an input/output circuit. The data read/write process of this memory will be described with reference to the flow chart shown in FIG. 17.

Figure 17:
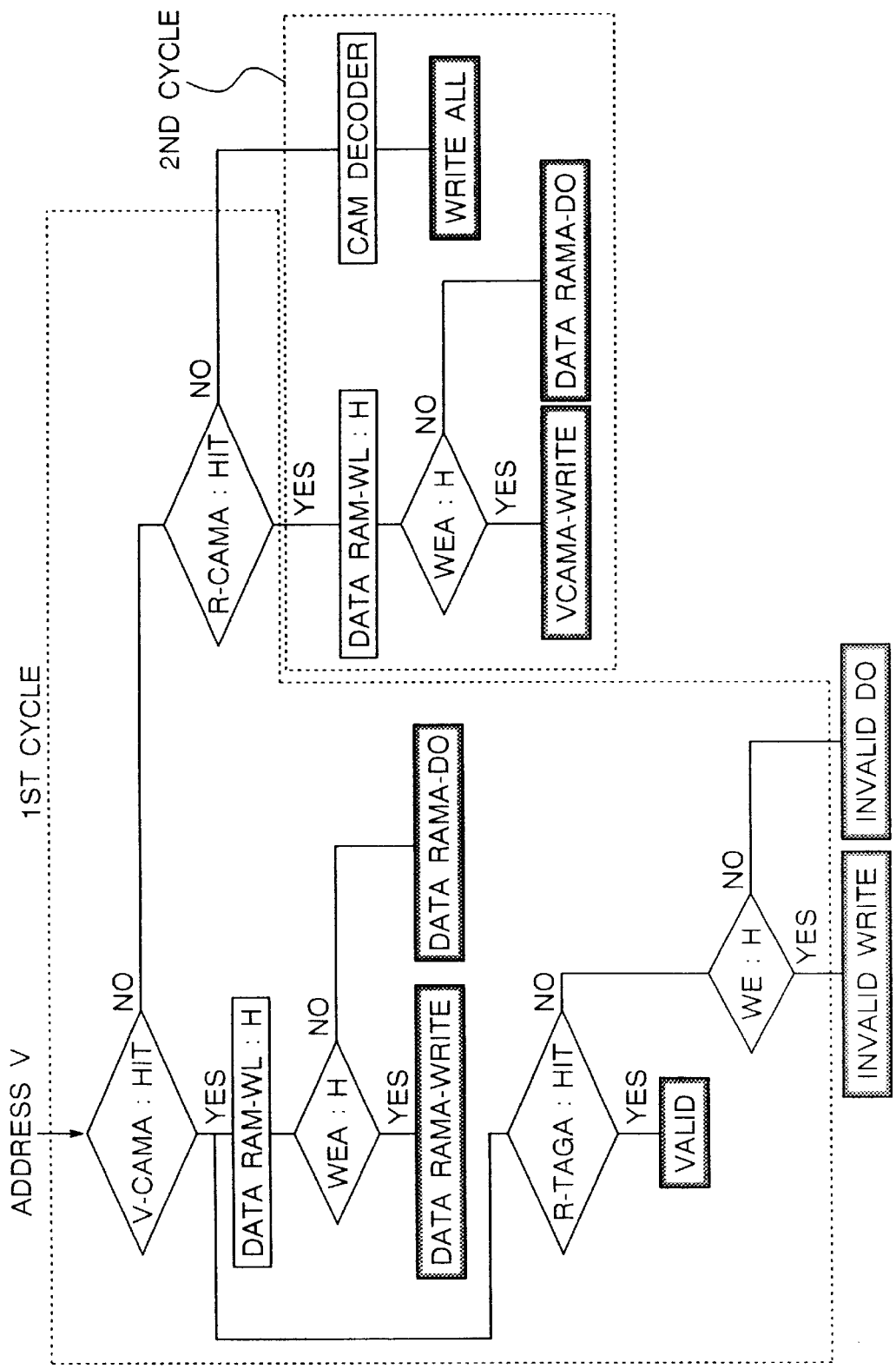
FIG. 17 is a diagram showing a process flow of data read/write of a cache memory of the invention.

In the cache memory of this invention, as shown in FIG. 17, when an address V of lower bits (about 28 bits) which is a portion of the virtual address is supplied, this address V is applied to C-CAM to judge whether there is any hit. The operation for a miss-hit will be described later. If there is any hit, the potential of the word line of the data RAM is raised, and data is written in the data RAM at the row with a hit if a write designation signal WEA is "H" level, whereas if WEA is "L", i.e., if the read is designated, the data is read from the data RAM at the row with a hit. At the time when C-CAM detects a hit, data with a hit is read from R-CAM and compared with a real address sent from TLB (Table Lookaside Buffer). If there is a coincidence, the above processes are confirmed as correct, and the further processes are executed. If there is no coincidence when the real address from TLB is compared, the above processes are not correct so that the write data is invalidated if WEA if "H". If WEA is "L", a process of invalidating the read data starts.

If a miss-hit is judged by the comparison at V-CAM, the real address sent from TLB is compared by using R-CAM. If this comparison indicates that there is a real address with a coincidence, the storage contents in the data RAM at the row of the real address with a coincidence are correct. Therefore, if WEA if "H", data in V-RAM at the row with a coincidence is replaced by the supplied new data, whereas if WEA if "L", data in the data RAM at the row with a coincidence is read.

If the comparison at R-CAM indicates a miss-hit, the data corresponding to the supplied address does not exist in the cache. In this case, a signal indicating that there is no data is issued to terminate the processes, if WEA is "L". If WEA is "H", a row is selected by using the CAM decoder, and all of the supplied real address, lower bits of the virtual address, and data in the data RAM are written to terminate the processes. With this processing method, as understood from FIG. 17, data write into the data RAM and data read from the data RAM are executed generally at the same timing. Incorporation of this feature allows a divisional execution of the data write process for wiring data into the memory and the data read process for reading data from the memory, with the same operations being executed for other memory circuits. It is therefore possible to perform the data read/write operation at high speed. This is one of the characteristics of the cache memory of this invention, the effects of which will be later detailed.

The input signal A has been described above. There is a second input signal B in the circuit shown in FIG. 16. The signal B is supplied only to the bank designated by a bans designation signal (a bank select bit 3 shown in FIG. 16), only when the bank does not conflict with the bank designated by the signal A. This signal B is processed in the similar manner to the signal A, by using input/output lines A, including a 2nd Din-B line and a 2nd Do-B line provided independently from input/output lines A. The functions and layouts of these signal lines will be later detailed with reference to FIG. 18. Since the signal lines A and B are provided in parallel, both the input signals A and B can be processed generally at the same time if the signals at the banks A and B do not conflict with each other. Furthermore, as described above, since the read/write processes are discriminately executed only for the input/output signals, both the input and output signals are discriminately sent via the 2nd Din-B line and 2nd Do-B line and the other operations are not required at all to be discriminately executed. Even if the read and write signals are mixedly used, for example, even if the signal A is to be written and the signal B is to be read, these signals can be processed without any adjustment of timings of the circuit operation or the like. Furthermore, since the same process is applied to all signal processing, this arrangement is suitable for a duplicated time sequential data process, so-called a wave pipeline operation. The invention can perform a 2-bank, 2-wave pipeline operation, realizing a quasi 4-port memory.

The circuit shown in FIG. 16 will be further detailed.

A large capacity memory is required as a cache memory so that the numbers of rows (entry number) of R-CAM and V-CAM become large. The number of entries is herein assumed to be 1024. With the entry number of 1024, even if a current of 0.1 mA is supplied to CAM for coincidence detection, the total current becomes 100 mA. In order to reduce this total current, the circuit structure of the CAM unit (1) and CAM unit (2) of this invention shown in FIG. 12 is used. Assuming that three bits are assigned to the CAM unit (2), the average current becomes about ⅛ and the total current can be lowered to 13 mA.

Figure 18:
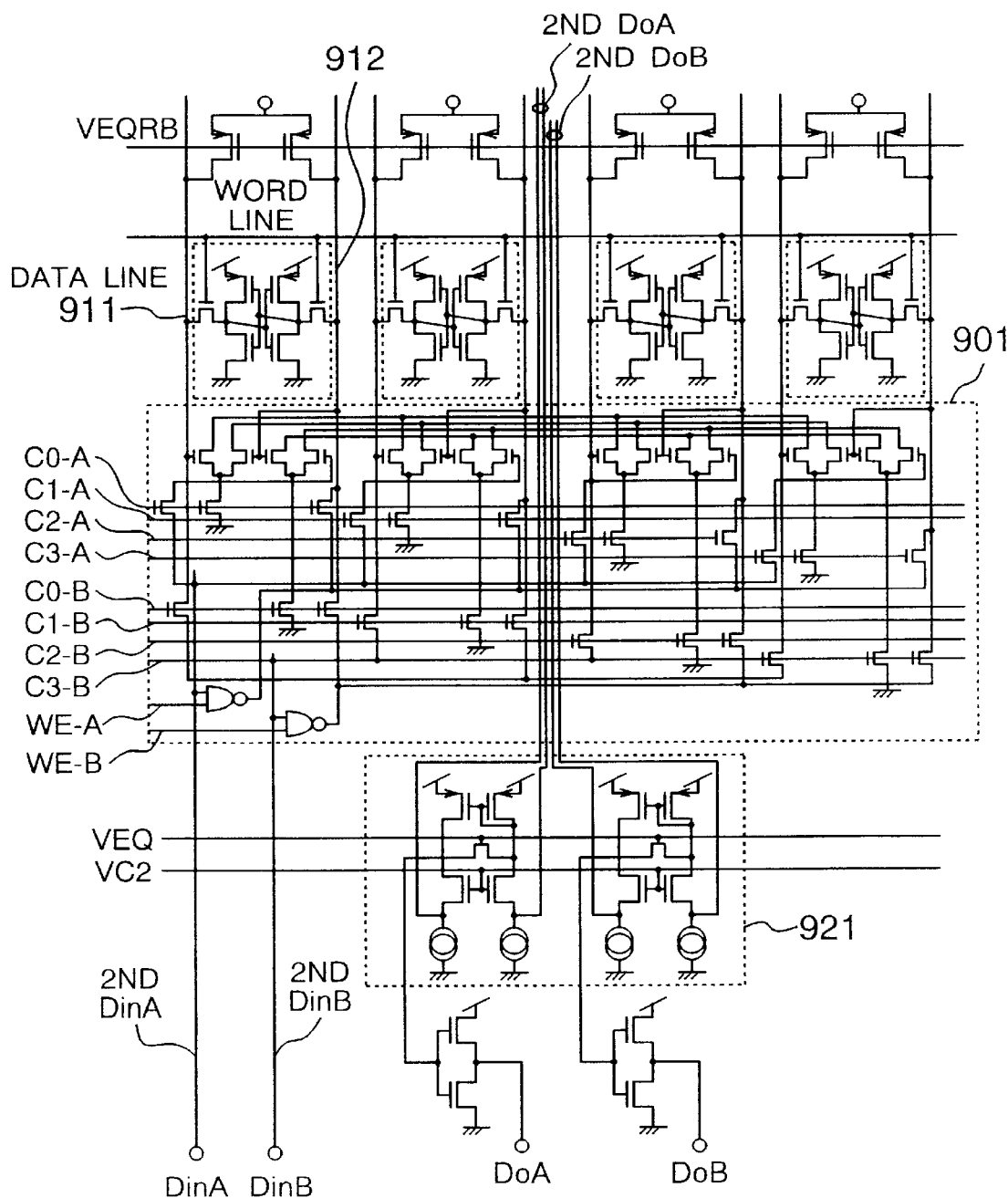
FIG. 18 is a circuit diagram showing a data RAM unit of a cache memory of the invention.

Next, the circuit shown in FIG. 16 associated with a 2nd Din-A line, a 2nd Do-A line and the 2nd Din-B and Do-B lines of the data RAM unit will be described. These signal lines are disposed on the data RAM from the bank 0 to bank 7. These signal lines are disposed on the data RAM and are used for sending a write signal of the data RAM to the data line of each bank (e.g., data line pair 911 and 912 in FIG. 18) via a circuit 901 shown in FIG. 18 or receiving a read signal from the data line pair 911 and 912 to send it to a detection circuit 921. These signal lines function in the same manner as the data line and are structured hierarchically, as the label "2nd" of the 2nd signal line indicates. FIG. 18 is a circuit diagram showing this circuit portion. A set of two 2nd Din lines (DinA, DinB) and four 2nd Do lines, six lines in total, are provided for four columns of the memory cells. Similar to the 2nd Do lines, the two second Din lines are disposed on each bank of the data RAM and extend upward over the memory cells. This layout is not shown in FIG. 18. In the above manner, one set of 2nd signal lines can be provided for four columns of the memory cells while suppressing an increase in the cell area. The reason why the Din signal lines are provided one for each A and B and the Do signal lines are provided two for each A and B, is that although the delay time increases less even if the amplitude of the Din signal is made large, the delay time increases much if the amplitude of the Do signal is made large. From this reason, two Do signal lines are used for transferring complementary signals at a small amplitude. In order to avoid the influence of the interline capacitance of the Di signal upon Do, the Do signal line pair is disposed symmetrically with the Din line. A two-input NAND gate is used for generating complementary signals from the Din signal. When the write signals WE-A and WE-B are "L", the Din complementary signals are made "H" to terminate the write operation. Obviously, use of two Din signal lines for A and B improve the degree of design freedom if there is no limit of the area increase. However, if one Din signal line is used for A and B, the number of twists of the signal line becomes small. In this connection, although not shown in FIG. 18, the so-called twisted line is used for equalizing the interline capacitances of the data read signal line pair Do and /Do relative to the write signal line Din, to thereby reduce cross-talk noises generated via interline capacitances between the write signal line Din and the data read signal line pair Do and/Do.

In this write circuit, the data line pair is both "H" before the data write. Therefore, for the data write, the data line is lowered to "L", and for the column select, a switch of NMOS only is sufficient.

In the read operation, a differential circuit of NMOSs is provided to each of Do-A and Do-B. By selecting MOSFETs which supply current to the differential amplifiers, a desired column and A and B signals can be selected. In this manner, switching MOSs for selecting the column and A and B can be omitted and the read time can be shortened. In the circuit shown in FIG. 9, the column switches C0-A to C3-B are used in common for both the read and write operations. This common switches reduce the number of signal lines. To this end, the high level of the column switch signal line is suppressed so that the data lines (e.g., 911, 912, etc.) and 2nd data lines (2nd DoA, 2nd DoB) are not made conductive during the data read. In this manner, the amplitude of a signal on the data line during the read operation is not limited and an increase of a load capacity of the data line via MOSFETs can be prevented. If there is a wiring space left, separation is possible. A MOSFET may be added to the data line which MOSFET becomes conductive and non-conductive by the write signal.

Figure 19:
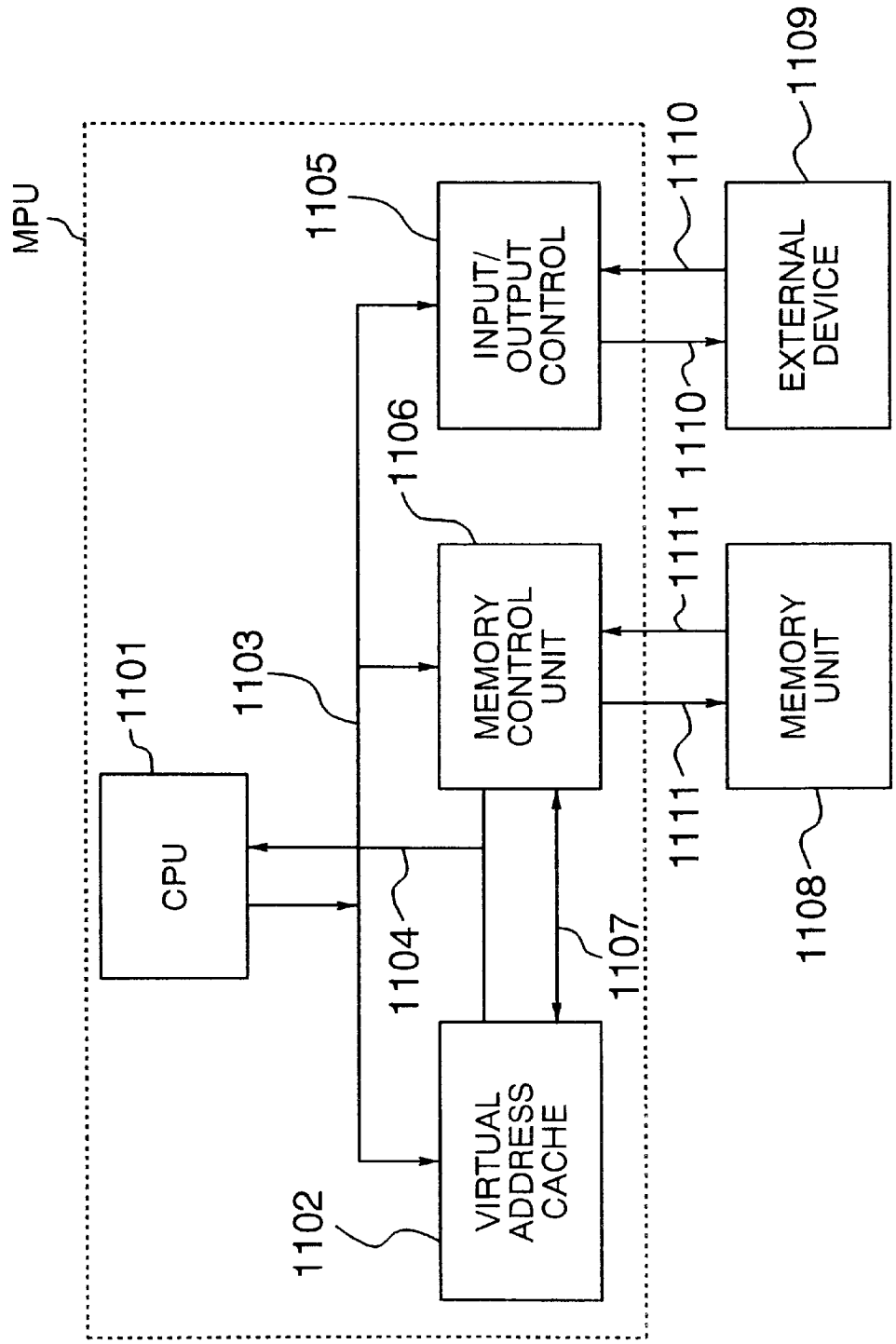
FIG. 19 is a block diagram of an MPU according to an embodiment of the invention.

FIG. 19 is a diagram showing an embodiment of a signal processing MPU using each of the above-described embodiments. An MPU surrounded by a broken line in FIG. 19 is implemented on a single semiconductor substrate made of silicon, for example, and a memory unit 1108 and an external device 1109 are connected to MPU.

Referring to FIG. 19, a virtual address cache 1102 is formed by a memory of one of the above-described embodiments. This cache is a so-called on-chip memory formed on the MPU chip. The virtual address cache 1102 is supplied with an address (virtual address) and a control signal for instructing a read/write or the like, via a bus 1103 from a CPU. The virtual address cache 1102 is configured as shown in FIG. 1, for example, and supplies output data corresponding to the input virtual address to CPU 1101 via a bus 1104. A supply of output data to CPU may be performed via the bus 1103 instead of the bus 1104. In the case of a miss-hit where there is no corresponding output data in the virtual address cache 1102, a signal indicating a miss-hit is supplied from the virtual address cache 1102 to a memory control unit 1106 via a bus 1107 which in turn reads the corresponding data from an external memory unit and writes it again in the virtual address cache 1102. The circuit is configured so that a real address can be transferred from the memory control unit 1106 via the bus 1107, as shown in FIG. 16. The external device 1109 disposed at the outside of MPU is an input/output device or the like and is controlled by an input/output control unit 1105.

As described above, the memory device of this invention can realize low power consumption without degrading a high speed operation. MPU made of such a memory device can reduce the total power of MPU.

Figure 20:
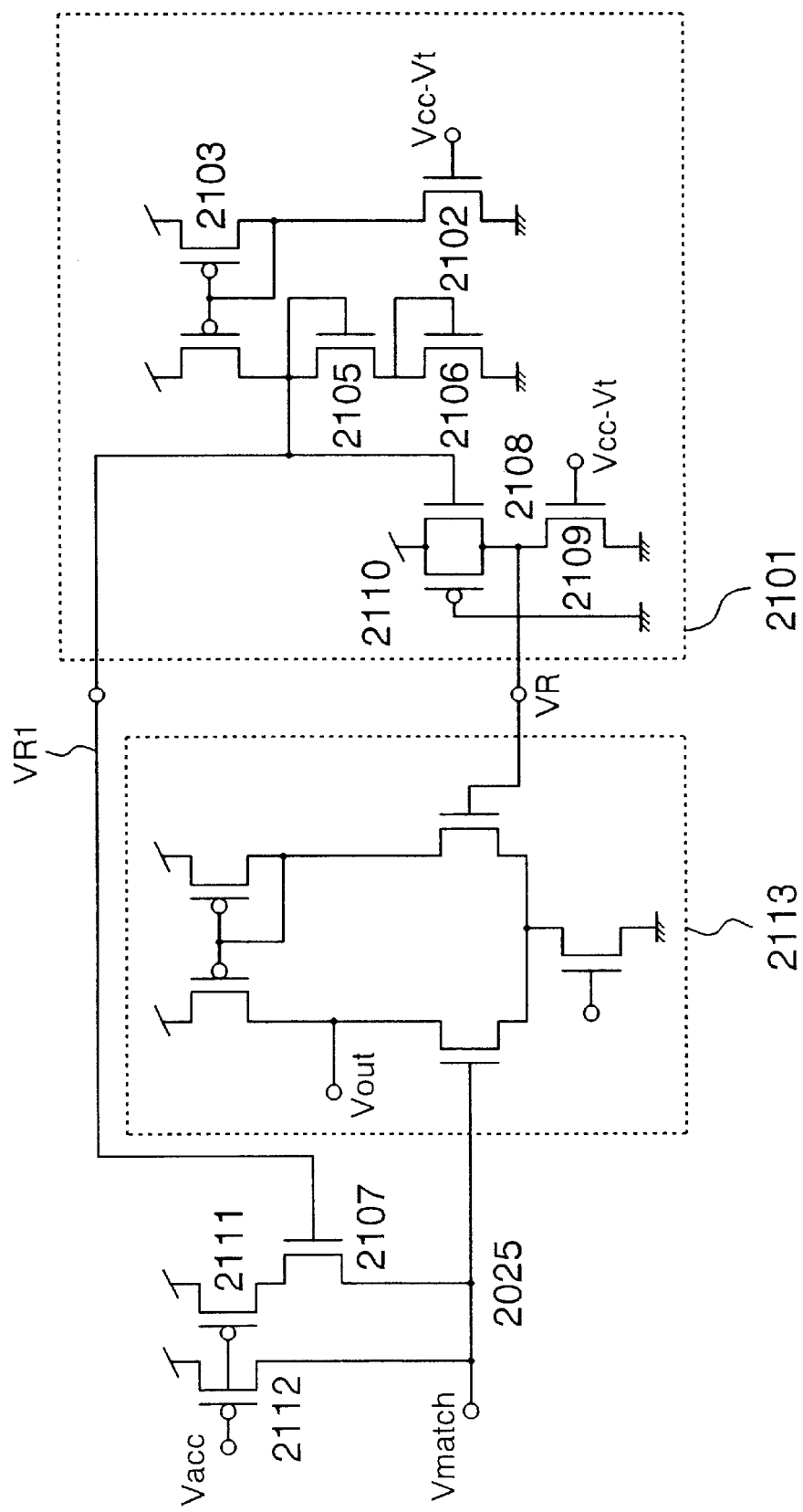
FIG. 20 is a diagram showing an example of a coincidence-detecting circuit of the invention.

FIG. 20 is a circuit diagram showing another embodiment of the invention. This circuit allows high speed data coincidence detection of CAM shown in FIGS. 11 and 12. This circuit will be described in detail with reference to FIG. 20.

A reference voltage generator circuit 2101 generates a reference voltage, like the reference voltage generator circuit 139 of the circuit shown in FIG. 11. A MOSFET 2102 has the same configuration as MOSFET 23 in the CAM cell 23 shown in FIG. 11. A voltage (Vcc–Vt) applied to the gate is a high level of the coincidence-detecting voltage of the cell 23, the high level corresponding to the voltage applied to the gate of MOSFET 26, Vcc being the positive power source voltage, and Vt being the threshold voltage of MOSFET. With this gate voltage application, current same as that flowing at the CAM cell with no-coincidence is supplied to a PMOSFET 2103. The same current supplied via a PMOSFET having the same configuration as PMOSFET 2103 is supplied to NMOSFETs 2105 and 2106, thereby generating VR1. This circuit sets VR1 to a potential of about a twofold of the threshold voltage Vt of NMOSFET. VR1 is not required to be strictly this potential, but a voltage having a different potential may be generated. However, if the potential is set to about a twofold of Vt, the potential of a reference voltage VR to be later described is set to Vt so that the power consumption of a differential amplifier 2113 becomes small and a high speed operation becomes possible. VR1 is applied to the gates of NMOSFETs 2107 and 2108 so that a high level potential of a coincidence-detecting signal line 2025 and a reference voltage line VR is determined. A PMOSFET 2109 has the same configuration as MOSFET 2102, and a PMOSFET 2110 supplies current more than by about 20% of the supply current of a PMOSFET 2112 to the coincidence-detecting signal line. PMOSFET 2112 supplies current to the coincidence-detecting signal line 2025 during a predetermined time period during which the gate thereof is maintained at the ground level. A circuit 2113 surrounded by a broken line is a differential circuit having a well known current mirror circuit as its load, and a coincidence-detecting output is supplied from its terminal Vout. The detailed description of this circuit is omitted. It can be obviously understood that this differential circuit 2113 may be replaced by another circuit, the description thereof being also omitted.

Figure 21:
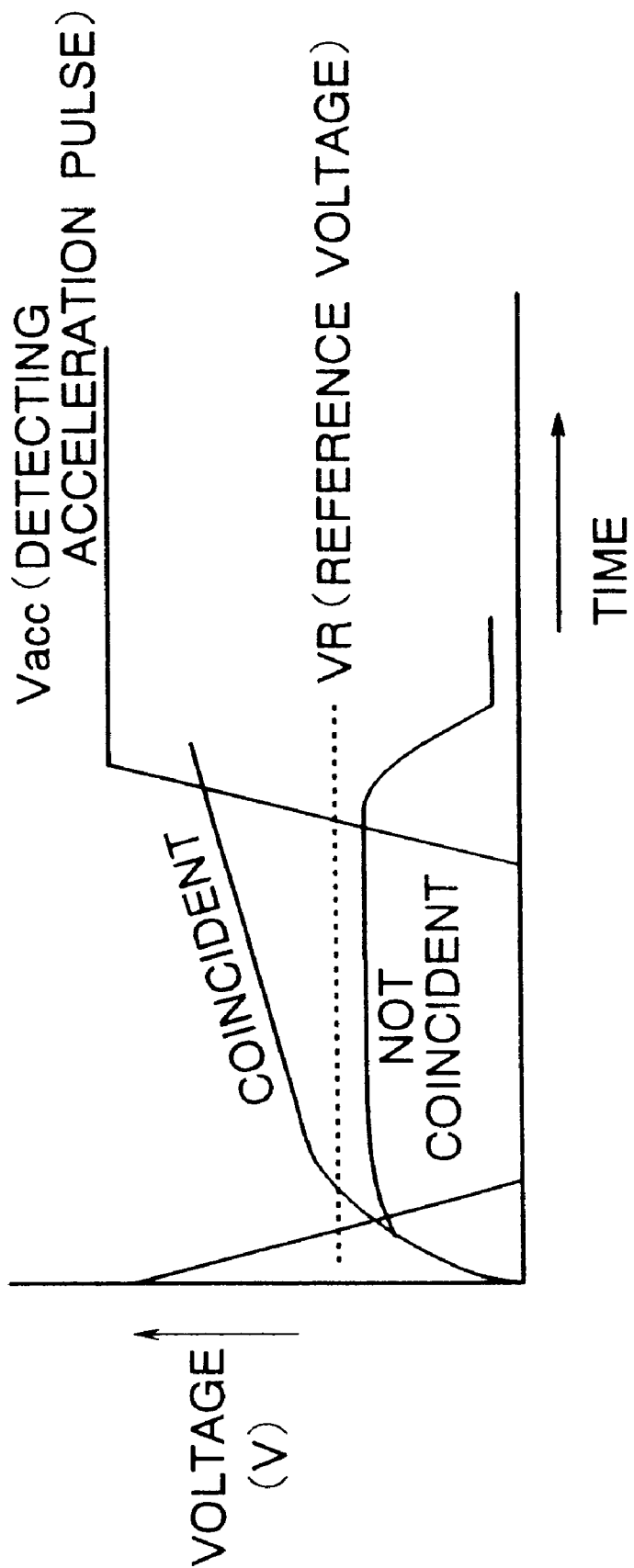
FIG. 21 is a diagram showing examples of voltage waveforms of the coincidence-detecting circuit of the invention.

FIG. 21 shows a change in the potentials at main nodes with time, illustrating the operation of the circuit shown in FIG. 20. As a signal Vaa controlling a current supply to the coincidence-detecting signal line 2025 changes from Vcc to the ground level, the potential of a voltage waveform rises with time as indicated at "coincident" in FIG. 21 if all CAM cells connected to the coincidence-detecting signal line have a coincidence. The potential change is fast from the time when Vaa is lowered to the ground level to the time when the potential rises to the reference voltage VR. This is because current is supplied via NMOSFET 2107 to PMOSFET 2111 until the potential rises to the reference voltage VR. When the potential rises to VR, the voltage between the gate and source of NMOSFET 2107 becomes the threshold voltage Vt so that the current supply via NMOSFET 2107 stops and the potential rise speed lowers. If only one of the CAM cells connected to the coincidence-detecting signal line 2025 has a non-coincidence, a change in the potential of the coincidence-detecting signal line with time becomes as indicated at "not coincident". In this case, although the current continues to be supplied via NMOSFET 2107 to PMOSFET 2112, the current supplied by PMOSFET 2112 is smaller than the current supplied by PMOSFET 2110. Therefore, the potential does not rise to the reference voltage VR but stops intermediately. If two or more or the CAM cells connected to the coincidence-detecting signal line 2025 have a non-coincidence, the potential rise lowers further, as will be understood easily. As described above, the circuit shown in FIG. 1 can detect a coincidence from a difference between the potential of the coincidence-detecting signal line and the potential VR of the reference voltage line. Furthermore, immediately after Vaa is lowered to the ground level, the coincidence-detecting signal line is raised quickly to the reference voltage VR by the current supplied by MOSFETs 2107 and 2111, so that a high speed coincidence detection is possible. Still further, since the potential of the coincidence-detecting signal line does not exceed the reference voltage VR, it is not necessary to strictly control the time period while Vaa is maintained at the ground potential, facilitating the control of the circuit operation which is the feature of the embodiment circuit. During the time period while Vaa is set to the ground level, current continues to be supplied to the non-coincident coincidence-detecting signal line by MOSFETs 2107 and 2111, it is desired that Vaa be raised to the high level immediately after the coincidence-detecting signal is output and the current supply is stopped in order to reduce the power consumption.

We claim:

1. A semiconductor integrated circuit comprising:
   an input signal line;
   a memory cell;
   a switching circuit becoming non-conductive when a comparison between input data inputted from said input signal line and data stored in said memory cell indicates a coincidence, and becoming conductive when the comparison indicates a non-coincidence;
   a coincidence-detecting signal line connected to said switching circuit, being supplied with a current while said input data is compared with said data stored in said memory cell; and
   a comparator connected to said coincidence-detecting signal line, detecting a potential of said coincidence-detecting signal line by a change of said current.

2. A semiconductor integrated circuit according to claim 1, wherein said switching circuit is a field effect transistor.

3. A semiconductor integrated circuit according to claim 2, wherein a drain of said field effect transistor is connected to said coincidence-detecting signal line, and a source of said field effect transistor is supplied with a predetermined potential.

4. A semiconductor integrated circuit according to claim 2, wherein said comparator is connected to a reference signal line having an electrostatic capacitance of a same degree as said coincidence-detecting signal line.

5. A semiconductor integrated circuit comprising:
   a plurality of input signal lines;
   a plurality of memory cells;
   a plurality of switching circuits, each of said plurality of switching circuits becoming non-conductive when a comparison between input data inputted from one of said plurality of input signal lines and data stored in one of said plurality of memory cells indicates a coincidence and becoming conductive when the comparison indicates a non-coincidence;
   a coincidence-detecting signal line connected to said plurality of switching circuits, being supplied with a current while said input data is compared with said data stored in said memory cell; and
   a comparator connected to said coincidence-detecting signal line, detecting a potential of said coincidence-detecting signal line by a change of said current.

6. A semiconductor integrated circuit according to claim 5, wherein each of said plurality of switching circuits is a field effect transistor.

7. A semiconductor integrated circuit according to claim 6, wherein a plurality of drains of said field effect transistors are connected to said coincidence-detecting signal line, and a plurality of sources of said field effect transistors are supplied with a predetermined potential.

8. A semiconductor integrated circuit according to claim 6, wherein
   said comparator is connected to a reference signal having an electrostatic capacitance of a same degree as said coincidence-detecting signal line.

9. A semiconductor integrated circuit comprising:
   an input signal line;
   a plurality of memory cells;
   a plurality of switching circuits, each of said plurality of switching circuits becoming non-conductive when a comparison between input data inputted from said input signal line and data stored in one of said plurality of memory cells indicates a coincidence and becoming conductive when the comparison indicates a non-coincidence;
   a plurality of coincidence-detecting signal lines, each of said plurality of coincidence-detecting signal lines being connected to one of said plurality of switching circuits and being supplied with a current while said input data is compared with said data stored in said memory cell; and
   a plurality of comparators connected to each of said coincidence-detecting signal lines, each of said plurality of comparators detecting a potential of said coincidence-detecting signal line by a change of said current.

10. A semiconductor integrated circuit according to claim 9, wherein each of said plurality of switching circuits includes a field effect transistor.

11. A semiconductor integrated circuit according to claim 10, wherein each of a plurality of drains of said field effect transistors is connected to one of said plurality of coincidence-detecting signal lines.

12. A semiconductor integrated circuit according to claim 10, wherein each of said plurality of comparators is connected to a reference signal line.

* * * * *